(12) United States Patent
Zhang

(10) Patent No.: US 12,063,794 B2
(45) Date of Patent: Aug. 13, 2024

(54) HIGH-DENSITY THREE-DIMENSIONAL VERTICAL MEMORY

(71) Applicant: Southern University of Sciene and Technology, ShenZhen (CN)

(72) Inventor: Guobiao Zhang, Corvallis, OR (US)

(73) Assignee: Southern University of Science and Technology, GuangDong (CN)

( * ) Notice: Subject to any disclaimer, the term of this patent is extended or adjusted under 35 U.S.C. 154(b) by 552 days.

(21) Appl. No.: 17/334,810

(22) Filed: May 31, 2021

(65) Prior Publication Data
US 2022/0165794 A1 May 26, 2022

(30) Foreign Application Priority Data

| Nov. 24, 2020 | (CN) | 202011330736.7 |
| Dec. 29, 2020 | (CN) | 202011591908.6 |
| Dec. 30, 2020 | (CN) | 202011645361.3 |
| May 26, 2021 | (CN) | 202110574892.6 |

(51) Int. Cl.
*H10B 63/00* (2023.01)
*H10N 70/00* (2023.01)

(52) U.S. Cl.
CPC ............ *H10B 63/84* (2023.02); *H10B 63/20* (2023.02); *H10N 70/841* (2023.02); *H10N 70/063* (2023.02)

(58) Field of Classification Search
None
See application file for complete search history.

(56) References Cited

U.S. PATENT DOCUMENTS

| 4,404,655 A | 9/1983 | Naiff |
| 4,424,579 A | 1/1984 | Roesner |
| 4,598,386 A | 7/1986 | Roesner et al. |
| 4,603,341 A | 7/1986 | Bertin et al. |
| 4,646,266 A | 2/1987 | Ovshinsky et al. |
| 4,796,074 A | 1/1989 | Roesner |
| 4,939,568 A | 7/1990 | Kato et al. |
| 5,257,224 A | 10/1993 | Nojiri et al. |
| 5,272,370 A | 12/1993 | French |
| 5,375,085 A | 12/1994 | Gnade et al. |
| 5,455,435 A | 10/1995 | Fu et al. |
| 5,468,983 A | 11/1995 | Hirase et al. |
| 5,721,169 A | 2/1998 | Lee |
| 5,751,012 A | 5/1998 | Wolstenholme et al. |
| 5,825,686 A | 10/1998 | Schmitt-Landsiedel et al. |

(Continued)

*Primary Examiner* — Mounir S Amer

(57) ABSTRACT

High-density three-dimensional (3-D) vertical memory (3D-$M_V$) includes lightly-doped-segment (LDS) 3D-$M_V$ and non-circular-hole (NCH) 3D-$M_V$. The preferred LDS 3D-$M_V$ takes advantage of longitudinal space, instead of lateral space, to guarantee normal write operation. On the other hand, the lateral cross-section of the memory hole of the preferred NCH 3D-$M_V$ includes at least two intersecting pairs of parallel sides, with each pair formed through a single DUV exposure and having a minimum spacing <50 nm.

6 Claims, 20 Drawing Sheets

(56) References Cited

U.S. PATENT DOCUMENTS

| | | | |
|---|---|---|---|
| 5,835,396 | A | 11/1998 | Zhang |
| 5,838,530 | A | 11/1998 | Zhang |
| 5,841,150 | A | 11/1998 | Gonzalez et al. |
| 5,843,824 | A | 12/1998 | Chou et al. |
| 5,847,442 | A | 12/1998 | Mills, Jr. et al. |
| 5,854,111 | A | 12/1998 | Wen |
| 5,904,526 | A | 5/1999 | Wen et al. |
| 5,907,778 | A | 5/1999 | Chou et al. |
| 5,943,255 | A | 8/1999 | Kutter et al. |
| 6,015,738 | A | 1/2000 | Levy et al. |
| 6,021,079 | A | 2/2000 | Worley |
| 6,034,882 | A | 3/2000 | Johnson et al. |
| 6,049,481 | A | 4/2000 | Yamasaki |
| 6,055,180 | A | 4/2000 | Gudesen et al. |
| 6,185,122 | B1 | 2/2001 | Johnson et al. |
| 6,221,723 | B1 | 4/2001 | Kunitou |
| 6,236,587 | B1 | 5/2001 | Gudesen et al. |
| 6,380,597 | B1 | 4/2002 | Gudesen et al. |
| 6,624,485 | B2 | 9/2003 | Johnson |
| 6,717,222 | B2 | 4/2004 | Zhang |
| 8,829,646 | B2 | 9/2014 | Lung et al. |
| 10,566,388 | B2 | 2/2020 | Zhang |
| 10,937,834 | B2 | 3/2021 | Zhang |
| 2018/0226414 | A1* | 8/2018 | Zhang ................ G11C 13/0004 |

\* cited by examiner

HIGH-DENSITY THREE-DIMENSIONAL VERTICAL MEMORY

CROSS-REFERENCE TO RELATED APPLICATIONS

This application claims priorities from Chinese Patent Application No. 202011330736.7, filed Nov. 24, 2020; Chinese Patent Application No. 202011591908.6, filed Dec. 29, 2020; Chinese Patent Application No. 202011645361.3, filed Dec. 30, 2020; Chinese Patent Application No. 202110574892.6, filed May 26, 2021, in the State Intellectual Property Office of the People's Republic of China (CN), the disclosure of which is incorporated herein by references in their entirety.

BACKGROUND

1. Technical Field of the Invention

The present invention relates to the field of integrated circuits, and more particularly to a three-dimensional memory.

2. Prior Art

Three-dimensional (3-D) vertical memory (3D-$M_V$) comprises a plurality of vertical memory strings. Each vertical memory string comprises a plurality of memory cells vertically stacked along a memory hole. Compared with a conventional memory whose memory cells are disposed on a two-dimensional (2-D) plane, the 3D-$M_V$ has a larger storage density and a lower storage cost because its memory cells are disposed in a 3-D space. 3D-NAND is a transistor-based 3D-$M_V$ and is in mass production. Its memory cells contain programmable transistors. To be more specific, each memory hole comprises five layers, including oxide, nitride, oxide (gate dielectric and ONO charge-storage layer), poly (channel layer), oxide (inner dielectric). To accommodate these five layers, the diameter of the memory hole is relatively large (~80 nm).

U.S. Pat. No. 10,937,834 B2 issued to Zhang on Mar. 2, 2021 (hereinafter '834 patent) discloses a diode-based 3D-$M_V$. Its memory cells contain programmable diodes. Comprising fewer layers, its memory hole could have a smaller diameter than 3D-NAND. FIG. 1A of the '834 patent (not included in the figures of this specification) shows that the diode-based 3D-$M_V$ comprises a substrate circuit 0K, horizontal address lines 8a-8h, memory holes 2a-2d, programmable layers 6a-6d, vertical address lines 4a-4d, and memory cells 1aa-1h. The substrate circuit 0K is disposed on a semiconductor substrate 0. The horizontal address lines 8a-8h are stacked on the substrate circuit 0K and separated from each other with inter-level dielectrics 5a-5g. The memory holes 2a-2d penetrate through the horizontal address lines 8a-8h and the inter-level dielectrics 5a-5g. The programmable layers 6a-6d covers the sidewalls of the memory holes 2a-2d. A conductive material fills the remaining portions of the memory holes 2a-2d and form the vertical address lines 4a-4d. The memory cells 1aa-1ha are formed at the intersections of the horizontal address lines 8a-8h and the vertical address lines 4a-4d. All memory cells 1aa-1ha disposed on a same vertical address line 4a are collectively referred to as a memory string 1A.

FIG. 1C of the '834 patent is a symbol for the memory cell 1. It is a programmable diode including a programmable layer 12 and a diode 14. The resistance of the programmable layer 12 can be altered with an electrical programming signal. The diode 14 has two terminals: an anode 1+ and a cathode 1−. The current can easily flow from the anode 1+ to the cathode 1−, but not vice versa. The diode has the following general property: when the applied voltage has a value smaller than the read voltage ($V_R$) or a polarity opposite to $V_R$, the diode 14 has a much larger resistance than its read resistance (i.e. resistance at $V_R$). In other patents or technical literatures, diode is also referred to as selector, steering element, quasi-conductive layer, or other names. They all have the same meaning in this specification.

The diode 14 is preferably a built-in diode, i.e. it is naturally formed between the horizontal address line 8a and the vertical address line 4a. The benefit is apparent: there would be no separate diode layer. During programming, a voltage of −$V_P$/2 ($V_P$ is the programming voltage, details will be explained in [Para 57] and FIG. 5C) is applied to selected diodes 14. To ensure that these diodes will not break down, the reverse breakdown voltage ($V_{BD}$) of the diodes 14 needs to satisfy the following requirement: $V_{BD}$>$V_P$/2. To meet this requirement, the diode 14 preferably comprises a lightly-doped region. For example, the P-N diode has a P+/i/N+ structure; or, the Schottky diode has a metal/i/N+ structure. In practice, the lightly-doped region could comprise lightly-doped N-type semiconductor material, intrinsic (i) semiconductor material, lightly-doped P-type semiconductor material, or a combination thereof.

FIG. 1 (in combination of FIG. 1E of the '834 patent) discloses a memory cell 1aa used in prior art. The anode 1+ of the diode 14 (referring to FIG. 1E of the '834 patent) is the horizontal address line 8a; the cathode 1− of the diode 14 (referring to FIG. 1E of the '834 patent) is the vertical address line 4ax. Generally speaking, the anode 1+(external electrode) comprises P+ semiconductor material (for P-N diode) or metallic material (for Schottky diode); the cathode 1− (internal electrode) comprises N+ semiconductor material. In FIG. 1, the memory hole 2a contains a lightly-doped region 4ay and a heavily-doped region 4ax. Its total diameter D' is equal to d'+2r'+2t', where d' is the diameter of the heavily-doped region 4ax, r' is the thickness of the lightly-doped region 4ay, and the t' is the thickness of the programmable layer 6a. Overall, prior art uses lateral space to increase $V_{BD}$. Because r' has a value of several nanometers to tens of micrometers, the memory hole 2a has a large diameter D'. This leads to a small storage density and a high storage cost.

On the other hand, the memory holes of the conventional 3D-$M_V$ are formed using DUV (deep ultra-violet) lithography. They all have a circular shape. The smallest circular holes formed with a single DUV exposure have a diameter of 54 nm and a horizontal pitch of 90 nm (distance between the centers of adjacent circular holes). Circular holes smaller than these have to be formed using EUV (extra ultra-violet) lithography, which is complex and expensive. It is highly desired to use the DUV lithography alone to form smaller memory holes.

Objects and Advantages

It is a principle object of the present invention to improve the storage density of the 3D-$M_V$ and lower its storage cost.

It is a further object of the present invention to minimize the dimension of the memory holes and simplify its manufacturing process.

It is a further object of the present invention to maintain enough $V_{BD}$ for the diode to ensure normal operations for the memory cells.

It is a further object of the present invention to improve the storage density of the 3D-$M_V$ using the DUV lithography alone.

It is a further object of the present invention to minimize the dimension/pitch of the memory holes in the 3D-$M_V$ using the DUV lithography alone.

It is a further object of the present invention to minimize the dimension/pitch of the holes in an integrated circuit using the DUV lithography alone.

In accordance with these and other objects of the present invention, the present invention discloses a high-density 3D-$M_V$.

SUMMARY OF THE INVENTION

The present invention discloses two types of high-density 3D-$M_V$: a lightly-doped-segment (LDS) 3D-$M_V$ and a non-circular-hole (NCH) 3D-$M_V$. The preferred LDS 3D-$M_V$ takes advantage of longitudinal space (along the depth direction of the memory hole, i.e. along the z direction), instead of lateral space (along the radius direction of the memory hole, i.e. along the x direction), to maintain enough $V_{BD}$ for the diode in a memory cell. Each memory hole includes a lightly-doped segment, which comprises lightly-doped region only, but not heavily-doped region. To be more specific, in the lightly-doped segment, the lightly-doped semiconductor material fully fills the memory hole laterally, and continuously traverses all horizontal address lines longitudinally. The total diameter of the memory hole D is equal to d+2t, wherein d is the diameter of the lightly-doped region 4a, t is the thickness of the programmable layer 6a. Apparently, D (in FIG. 2)<D' (in FIG. 1). This can help to increase the storage density of the 3D-$M_V$. On the other hand, the lightly-doped segment makes contact with a hole electrode at a contact interface. In general, the location of the contact interface is determined using the following method: suppose that the doping concentration at the lightly-doped segment is $N_1$ and the doping concentration at the hole electrode (heavily doped) is $N_2$, the contact interface is located at a position where the doping concentration is sqrt($N_1 \ast N_2$). Note that the shortest distance from the contact interface to the horizontal address lines, i.e. the interface-line distance (S), determines $V_{BD}$. For $V_P$=5V, $V_{BD}$>2.5V, S should be larger than 50 nm.

In addition to the horizontal address lines, the preferred LDS 3D-$M_V$ could further comprise at least one horizontal control layer. The horizontal control layer includes a plurality of horizontal control lines. Control transistors are formed at the intersections of the horizontal control lines and the lightly-doped segments. These control transistors are switches (e.g. pass gates) and collectively form a decoder for the 3D-$M_V$ array. Because the horizontal control lines are disposed between the horizontal address lines and the contact interface, the interface-line spacing (S) is larger than the vertical pitch (P) of the horizontal lines (e.g. horizontal control lines; or, horizontal address lines). With a typical P of more than 50 nm, this preferred structure ensures that $V_{BD}$>$V_P$/2.

Accordingly, the present invention discloses a three-dimensional vertical memory including horizontal address lines and memory holes there-through, each memory hole of said memory holes comprising: a programmable layer fully covering sidewalls of said memory hole; a lightly-doped segment comprising at least a lightly doped semiconductor material, wherein said lightly doped semiconductor material fully fills said memory hole laterally and continuously traverses said horizontal address line longitudinally; a hole electrode in contact with said lightly-doped segment at a contact interface and comprising at least a heavily doped semiconductor material or metallic material, wherein a smallest distance between said contact interface and said horizontal address lines is larger than 50 nm.

The present invention further discloses a three-dimensional vertical memory, comprising: a plurality of horizontal address lines; a plurality of memory holes through said horizontal address lines; a plurality of programmable layers covering sidewalls of said memory holes; a plurality of lightly-doped segments in said memory holes and comprising at least a lightly doped semiconductor material, wherein said lightly doped semiconductor material fully fills said memory holes laterally; at least a hole electrode in contact with said lightly-doped segments at a contact interface and comprising at least a heavily doped semiconductor material or metallic material; at least a horizontal control line between said horizontal address lines and said hole electrode; at least a control transistor at the intersection of said lightly-doped segment and said horizontal control line; wherein said lightly-doped segment continuously traverses all of said horizontal address lines and said horizontal control line longitudinally.

On the other hand, the memory holes of the conventional 3D-$M_V$ are formed using DUV (deep ultra-violet) lithography and they all have circular shape. The smallest circular holes formed with a single DUV exposure have a diameter of 54 nm and a horizontal pitch of 90 nm. To minimize the dimension of the memory holes, the present invention discloses a non-circular-hole (NCH) 3D-$M_V$. In fact, the DUV lithography is best at making parallel lines, not circles. The minimum width of parallel lines made through a single DUV exposure is 38 nm, with a minimum horizontal pitch of 76 nm. To take advantage of this property of the DUV lithography, the preferred NCH 3D-$M_V$ comprises a plurality of non-circular memory holes. The lateral cross-section (along the radius or x-y directions, not along the depth or z direction) of each non-circular memory hole includes two pairs of parallel sides. Each pair of parallel sides is formed with a single DUV exposure and has a spacing of <50 nm (could be as small as 38 nm). Examples of the preferred NCH 3D-$M_V$ include rectangular (or, square)-hole 3D-$M_V$, hexagonal-hole 3D-$M_V$ and others. To those skilled in the art, the concept of the NCH 3D-$M_V$ can be extended to other non-circular holes in any integrated circuit.

Accordingly, the present invention discloses a lateral cross-section of a non-circular hole structure in an integrated circuit, comprising: a first pair of parallel sides formed through a first single DUV exposure, wherein a first spacing between said first pair is smaller than 50 nm; a second pair of parallel sides formed through a second single DUV exposure, wherein a second spacing between said second pair is smaller than 50 nm; said first and second pairs of parallel sides intersect with each other.

BRIEF DESCRIPTION OF THE DRAWINGS

FIG. 5B is an x-y top view of its horizontal address line 8a.

FIG. 14AA is an x-y top view at the first manufacturing step; FIG. 14AB is the z-x cross-sectional view of FIG. 14AA along the cutline B-B'; FIGS. 14BB-14BC are the z-x cross-sectional views of FIG. 14B along the cutlines C-C and D-D', respectively;

FIG. 16A is an x-y top view at this manufacturing step; FIG. 16B is its z-x cross-sectional view of FIG. 16A along the cutline E-E'.

Figure 1:
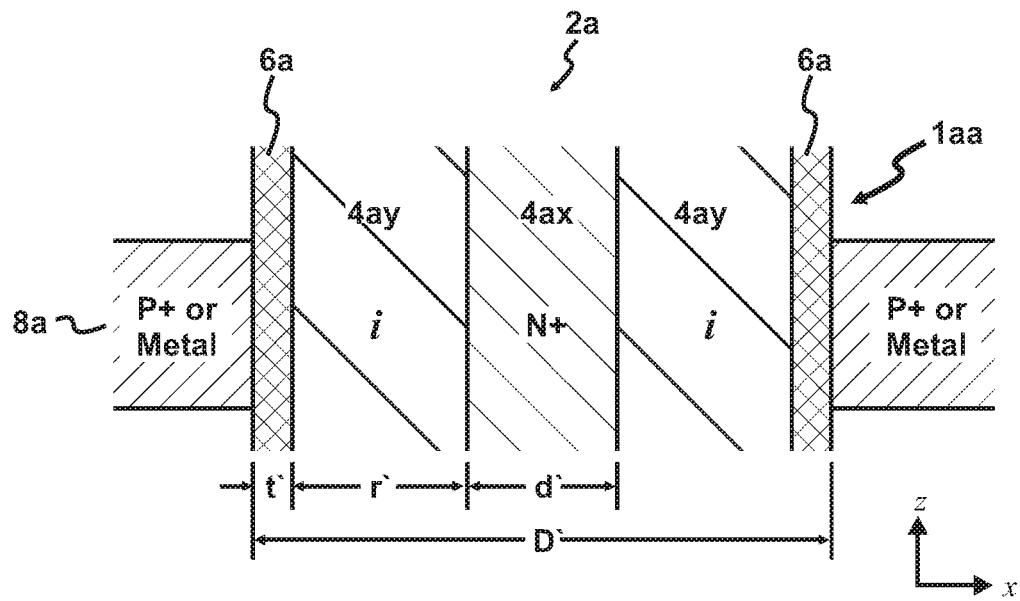
FIG. 1 is a z-x cross-sectional view of a prior-art 3D-$M_V$ cell. Its memory hole comprises a lightly-doped region and a heavily-doped region.

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments. The phrase "on the substrate" means the active elements (e.g. transistors) of a circuit are formed on the surface of the substrate, although the interconnects between these active elements are formed above the substrate and do not touch the substrate; the phrase "above the substrate" means the active elements are formed above the substrate and do not touch the substrate. The symbol "I" means a relationship of "and" or "or".

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

The present invention discloses two types of high-density 3D-M$_V$: a lightly-doped-segment (LDS) 3D-M$_V$ (FIGS. 2-12B) and a non-circular-hole (NCH) 3D-M$_V$ (FIGS. 13-16B). The preferred LDS 3D-M$_V$ takes advantage of longitudinal space (along the depth direction of the memory hole, i.e. along the z direction), instead of lateral space (along the radius direction of the memory hole, i.e. along the x direction), to ensure proper write operations of the memory cells, i.e. to maintain enough $V_{BD}$ so that $V_{BD} > V_P/2$.

Figure 2:
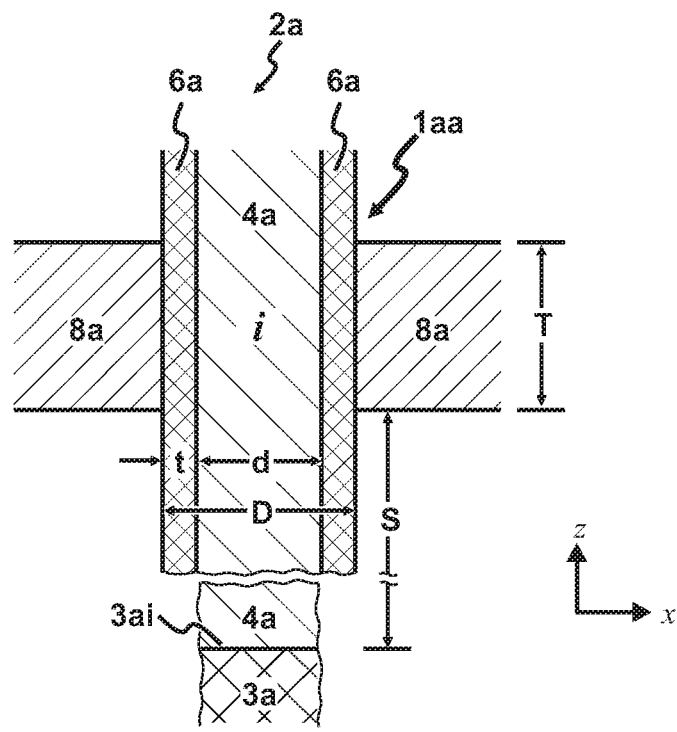
FIG. 2 is a z-x cross-sectional view of a preferred LDS 3D-$M_V$ cell. Its memory hole comprises only a lightly-doped region.

Referring now to FIG. 2 of the present invention, a preferred LDS 3D-M$_V$ cell 1aa is illustrated. It comprises a horizontal address line 8a, a memory hole 2a penetrating through the horizontal address line 8a, a programmable layer 6a fully covering sidewalls of the memory hole 2a, and a lightly-doped segment 4a disposed inside the memory hole 2a. Different from FIG. 1, the memory hole 2a within the lightly-doped segment 4a comprises the lightly-doped region only, but not the heavily-doped region. To be more specific, in the lightly-doped segment 4a, the lightly-doped semiconductor material fully fills the memory hole 2a laterally, and continuously traverses the horizontal address line 8a longitudinally. The total diameter (D) of the memory hole 2a is equal to d+2t, wherein d is the diameter of the lightly-doped region 4a, and t is the thickness of the programmable layer 6a. Apparently, D<D'. This can help to increase the storage density of the 3D-M$_V$.

The programmable layer 6a could be one-time-programmable (OTP), multiple-time-programmable (MTP) or re-programmable. For the OTP memory, the programmable layer 6a is an antifuse layer. Examples of the antifuse layer include silicon oxide, silicon nitride, or a combination thereof. For the MTP or re-programmable memory, the programmable layer 6 is a re-writable layer. Examples of the re-writable layer include resistive RAM (RRAM), phase-change material (PCM), conductive-bridge RAM, magnetic RAM (MRAM). The thickness of the programmable layer 6a is between 1 nm and 200 nm.

The memory cell 1aa further includes a hole electrode 3a, which comprises heavily-doped semiconductor material or metallic material. The horizontal address line 8a, the programmable layer 6a, the lightly-doped segment 4a and the hole electrode 3a form a programmable diode, which could have one of the following A)-D) structures:

A) P-N diode I—the horizontal address line 8a comprises P+ heavily-doped semiconductor material, whereas the hole electrode 3a comprises N+ heavily-doped semiconductor material;

B) P-N diode II—the horizontal address line 8a comprises N+ heavily-doped semiconductor material, whereas the hole electrode 3a comprises P+ heavily-doped semiconductor material;

C) Schottky diode I—the horizontal address line 8a comprises metallic material, whereas the hole electrode 3a comprises heavily-doped semiconductor material;

D) Schottky diode II—the horizontal address line 8a comprises heavily-doped semiconductor material, whereas the hole electrode 3a comprises metallic material.

In the above A)-D) diode structures, the lightly-doped segment 4a could comprise N− semiconductor material, intrinsic (i) semiconductor material, P− semiconductor material, or a combination thereof. To lower its resistance, the hole electrode 3a could further comprise a metallic layer.

In the memory cell 1aa, the hole electrode 3a makes contact with the lightly-doped segment 4a at the contact interface 3ai. In general, the location of the contact interface 3ai is determined using the following method: suppose that the doping concentration at the lightly-doped segment 4a is $N_1$ and the doping concentration at the heavily-doped hole electrode 3a is $N_2$, the contact interface 3ai is located at a position where the doping concentration is $sqrt(N_1*N_2)$. The shortest distance (S) between the contact interface 3ai and the horizontal address lines 8a-8h, i.e. the interface-line distance (S), determines $V_{BD}$: $V_{BD}$ increases with S. For $V_P$=5V, $V_{BD}$>2.5V, S should be larger than 50 nm.

The present invention further discloses two types of LDS 3D-$M_V$: singlet (FIGS. 3A-3C & FIGS. 5A-8B) and doublet (FIGS. 4A-4C & FIGS. 9A-12B). In a singlet, the 3D-$M_V$ array and its peripheral circuit are integrated into a single die; whereas, in a doublet, the 3D-$M_V$ array and its peripheral circuit are separated into two dice bonded face-to-face.

Figure 3A:
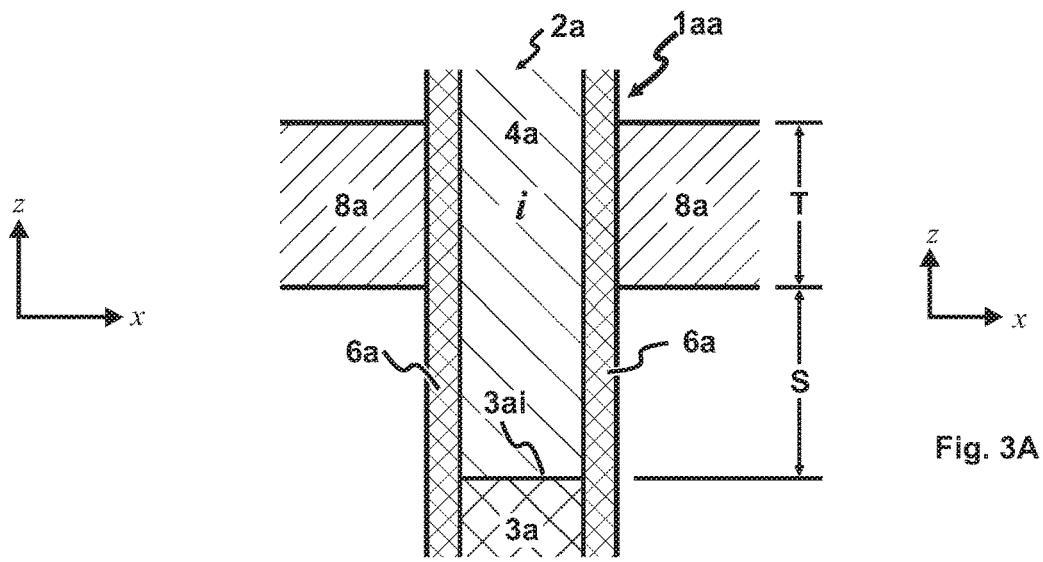
FIGS. 3A-3C are z-x cross-sectional views of a first type of LDS 3D-$M_V$ cells (singlet, including from first to third preferred embodiments), wherein the lightly-doped segment makes contact with the hole electrode at a lower end of the memory hole.
Figure 3B:
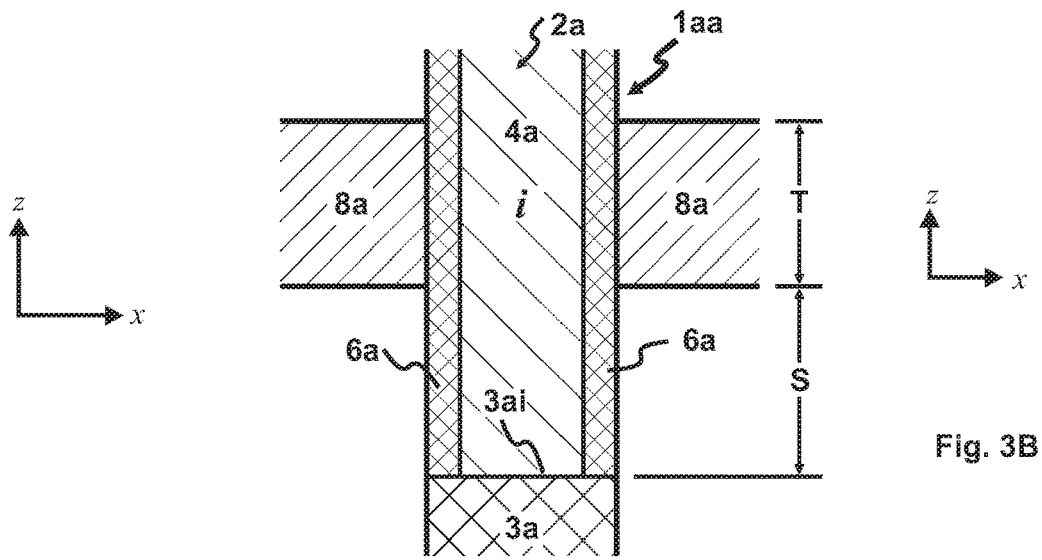
Figure 3C:
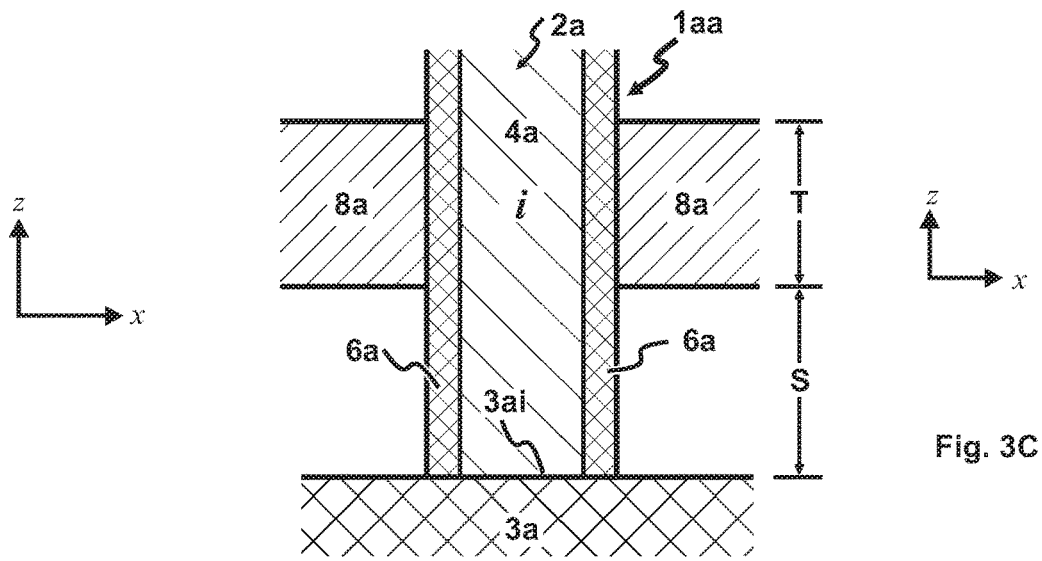

FIGS. 3A-3C illustrate the first type of LDS 3D-$M_V$ cells, i.e. singlet. For this type, the lightly-doped segment 4a makes contact with the hole electrode 3a at the lower end (toward the substrate 0 where the memory string 1A is disposed, i.e. along the –z direction) of the memory hole 2a. In the first preferred embodiment of FIG. 3A, the hole electrode 3a is disposed inside the memory hole 2a and surrounded by the programmable layer 6a laterally. In the second preferred embodiment of FIG. 3B, the hole electrode 3a is disposed inside the memory hole 2a, but not surrounded by any programmable layer. In the third preferred embodiment of FIG. 3C, the hole electrode is shared by a number of memory holes.

Figure 4A:
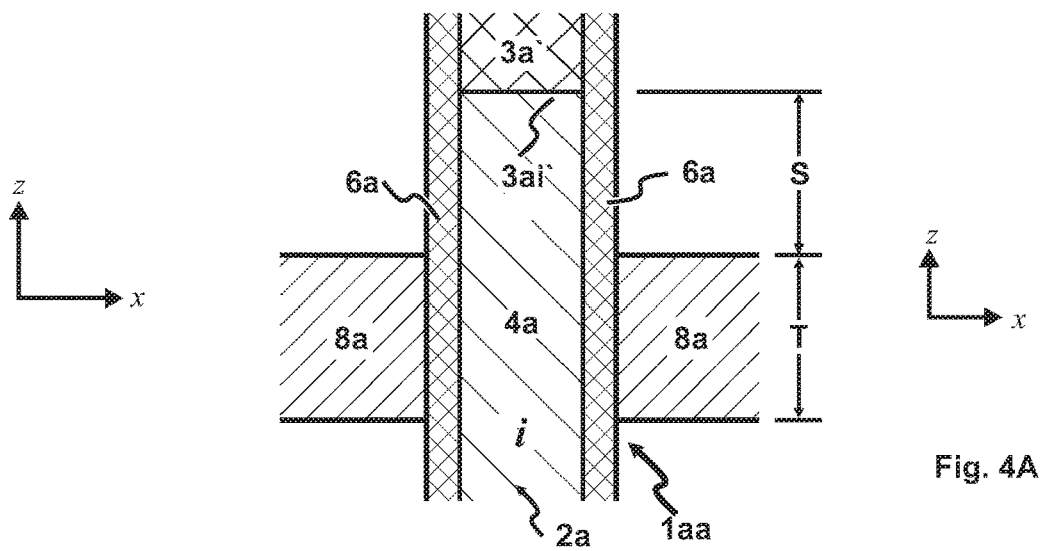
FIGS. 4A-4C are z-x cross-sectional views of a second type of LDS 3D-M$_V$ cells (doublet, including from fourth to sixth preferred embodiments), wherein the lightly-doped segment makes contact with the hole electrode at an upper end of the memory hole.
Figure 4B:
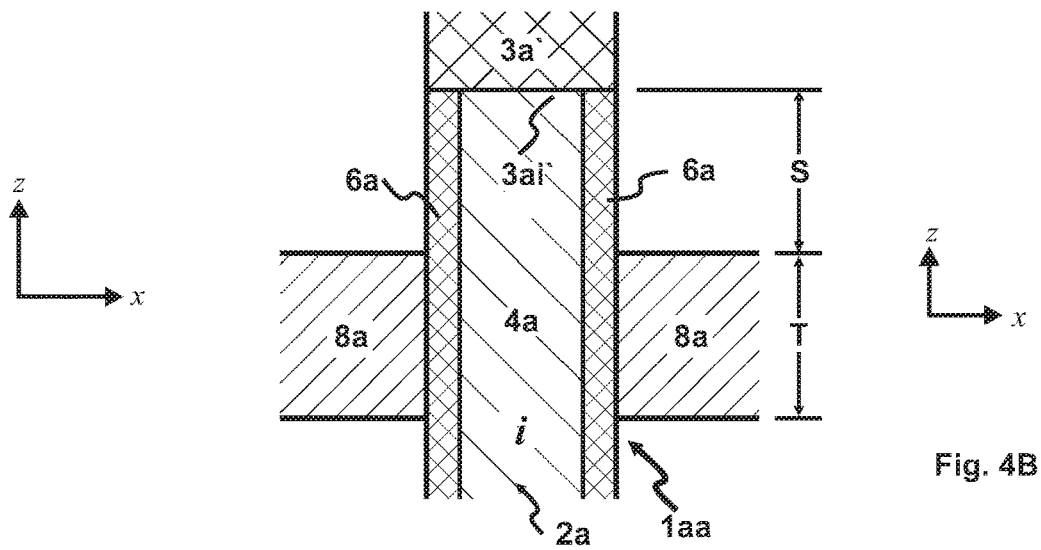
Figure 4C:
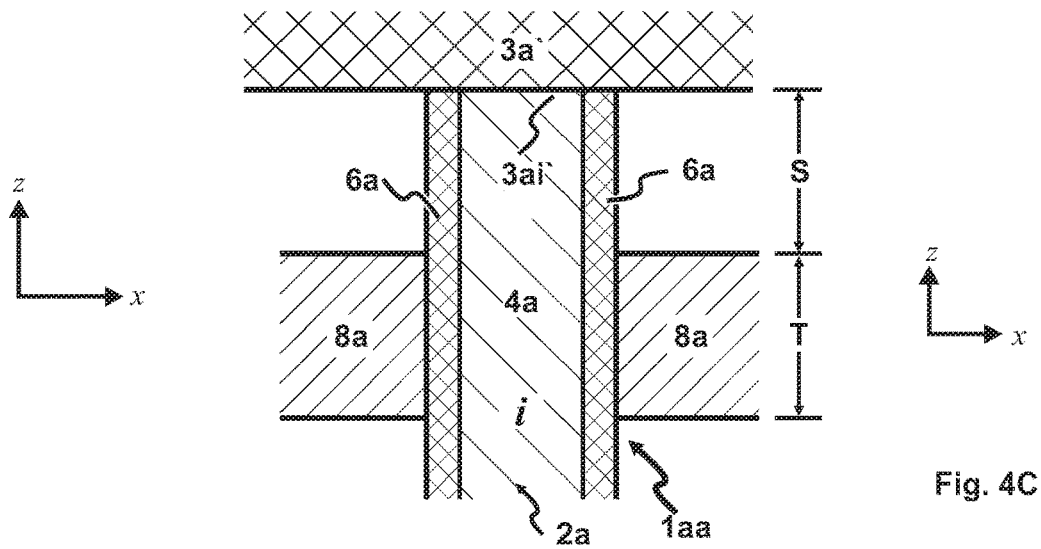

FIGS. 4A-4C illustrate the second type of LDS 3D-$M_V$ cells, i.e. doublet. For this type, the lightly-doped segment 4a makes contact with the hole electrode 3a' at the upper end (away from substrate 0 where the memory string 1A is disposed, i.e. along the +z direction) of the memory hole 2a. In the fourth preferred embodiment of FIG. 4A, the hole electrode 3a' is disposed inside the memory hole 2a and surrounded by the programmable layer 6a laterally. In the fifth preferred embodiment of FIG. 4B, the hole electrode 3a' is disposed inside the memory hole 2a, but not surrounded by any programmable layer. In the third preferred embodiment of FIG. 4C, the hole electrode is shared by a number of memory holes.

Referring now to FIGS. 5A-8B, three preferred embodiments of the first type of the LDS 3D-$M_V$ 100 (10) are disclosed, including their overall structures, circuit designs and manufacturing processes. They respectively use the memory cell 1aa of FIGS. 3A-3C. These preferred embodiments are singlets, i.e. the overall structure 100 is formed in a single 3D-$M_V$ die 10. Accordingly, these overall structures are labeled as both 100 and 10.

Figure 5A:
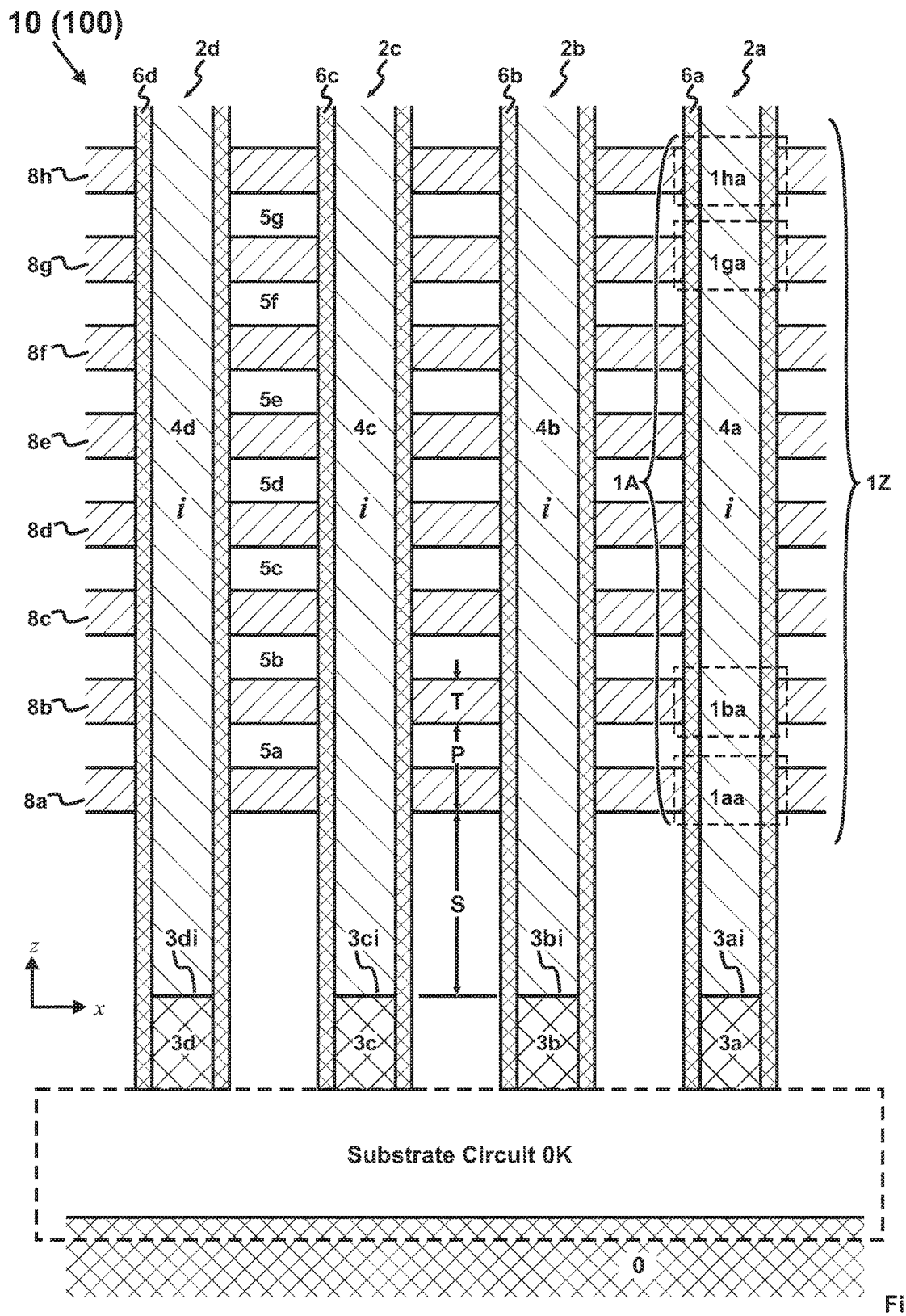
FIG. 5A is a z-x cross-sectional view of a first preferred LDS 3D-M$_V$ along the cutline A-A' of FIG. 5B.
Figure 5B:
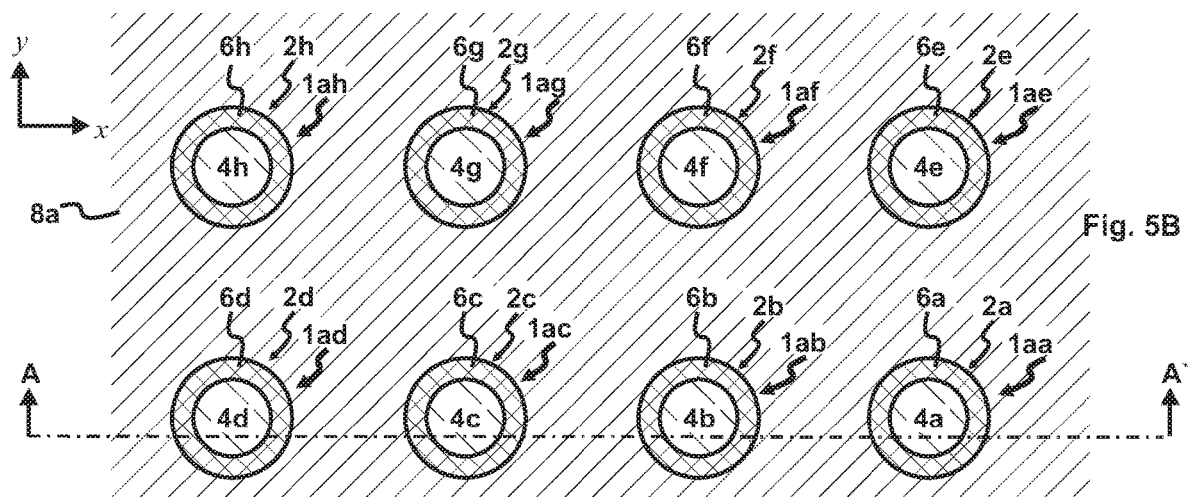

FIGS. 5A-5B disclose the overall structure of a first LDS 3D-$M_V$ 100, which uses the memory cell 1aa of FIG. 3A. As shown in FIG. 5A, the 3D-$M_V$ die 10 comprises vertically stacked horizontal address lines 8a-8h, memory holes 2a-2d penetrating through the horizontal address lines 8a-8h, programmable layers 6a-6d fully covering sidewalls of the memory holes 2a-2d, and lightly-doped segments 4a-4d disposed in the memory holes 2a-2d. The hole electrodes 3a-3d are disposed inside the memory holes 2a-2d and surrounded by the programmable layers 6a-6d laterally. Along the z direction, the horizontal address lines 8a-8h has a thickness of T and a vertical pitch (distance between the centers of adjacent vertically stacked horizontal address lines) of P. All memory cells 1aa-1ha along a same memory hole 2a form a memory string 1A; and, all memory strings associated with a same set of horizontal address lines 8a-8h form a 3D-$M_V$ array 1Z. The hole electrodes 3a-3d are disposed at the lower end of the memory holes 2a-2d. They make contacts with the lightly-doped segments 4a-4d at the contact interfaces 3ai-3di. The interface-line distance S meets the requirement: S>50 nm. The horizontal address line 8a of FIG. 5B takes the shape of a block and intersects at least two rows of memory holes 2a-2d, 2e-2h. Apparently, the horizontal address line 8a could take the shape of strip and intersect only a single row of memory holes (referring to FIG. 13).

Figure 5C:
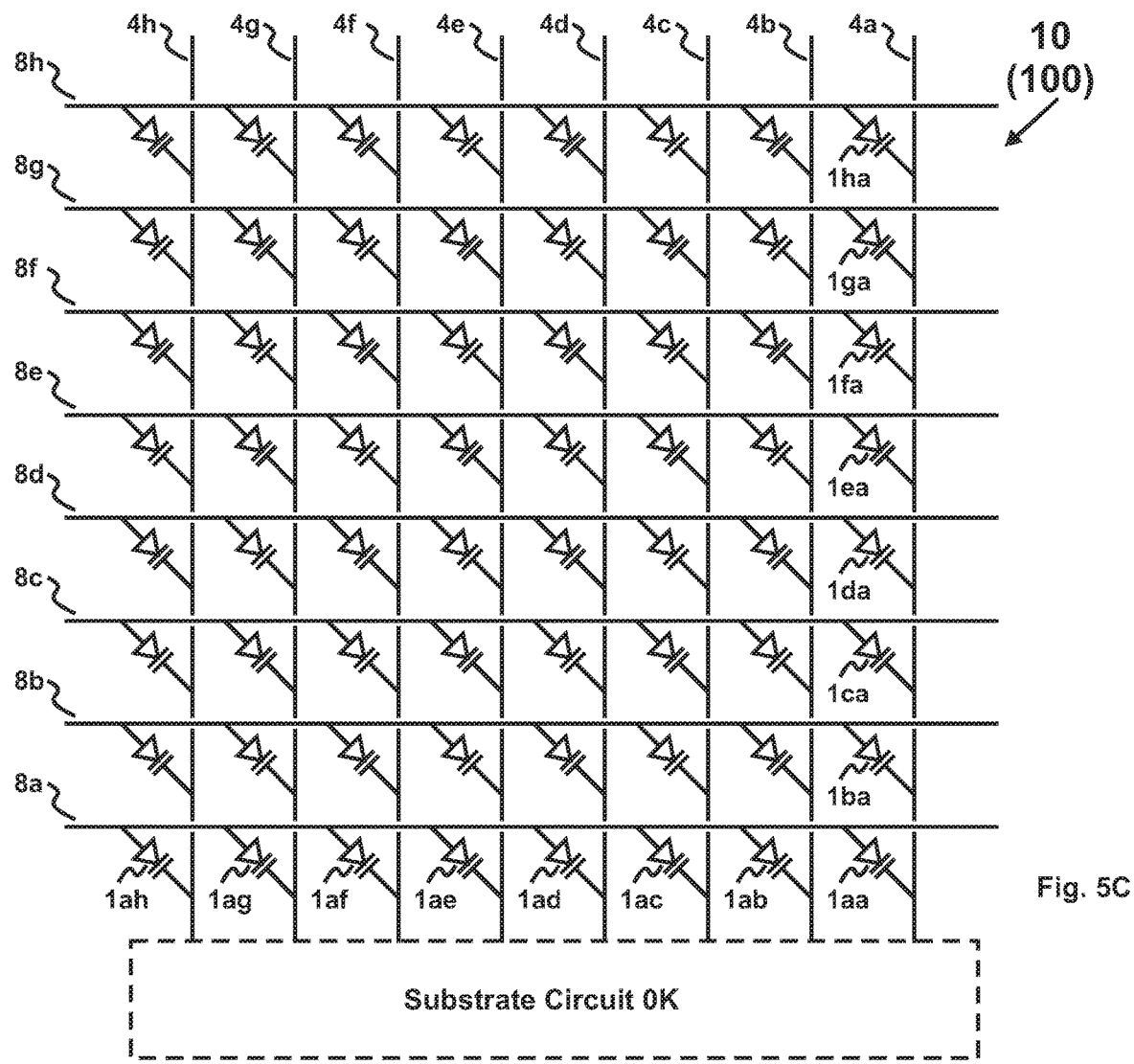
FIG. 5C is a circuit schematic of its 3D-M$_V$ array.

FIG. 5C is a circuit schematic of the 3D-$M_V$ array in the 3D-$M_V$ die 10 of FIGS. 5A-5B. In this embodiment, the horizontal address lines 8a-8h, coupled with the diode anodes of the memory cells 1aa-1ah, function as word lines; whereas, the vertical address lines 4a-4h, coupled with the diode cathodes of the memory cells 1aa-1ah, function as bit lines. During write (e.g. to write the memory cell 1aa), a voltage of $+V_P/2$ is applied to the word line 8a, while a voltage of $-V_P/2$ is applied to the bit line 4a, with all other word and bit lines grounded. As a result, the voltage on the memory cell 1aa is $V_P$, while the voltages on other memory cells are either 0 or $-V_P/2$. During read (e.g. to read the memory cells 1aa-1ah on the word line 8a), a read voltage $V_R$ is applied to the word line 8a, with all other word lines 8b-8h grounded. In this preferred embodiment, the bit lines 4a-4h are coupled with the substrate circuit 0K (including sense amplifiers). To those skilled in the art, the 3D-$M_V$ die 10 may use other write/read modes.

Figure 6A:
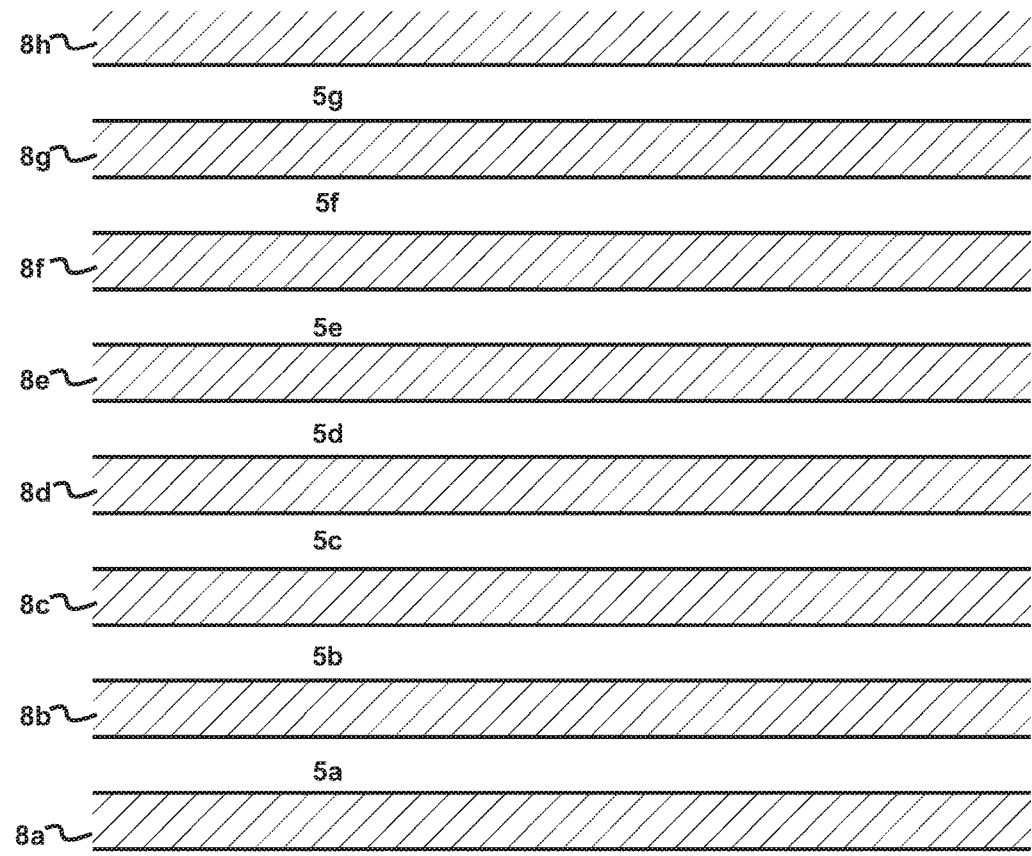
FIGS. 6A-6D are z-x cross-sectional views of four manufacturing steps of the first preferred LDS 3D-M$_V$.
Figure 6A:
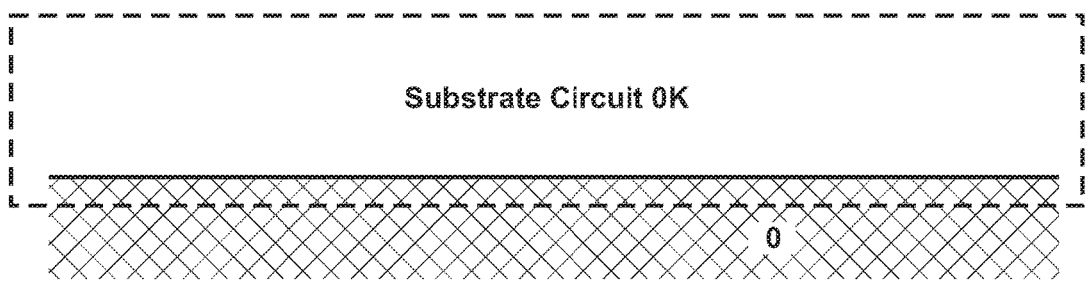

FIGS. 6A-6D illustrate four manufacturing steps for the first preferred LDS 3D-$M_V$ die 10. For reason of simplicity, the manufacturing steps for the substrate circuit 0K are omitted. An insulating layer 5z is formed on the substrate circuit 0K and planarized. Then a number of conductive layers (e.g. heavily-doped semiconductor material or metallic material) and inter-layer dielectric layers (e.g. silicon oxide, silicon nitride) are alternately deposited. This whole stack of layers are then etched together to form the horizontal address lines 8a-8h (FIG. 6A). Although only eight horizontal address lines are drawn in FIG. 6A, there could be tens to hundreds of horizontal address lines in a real product.

Figure 6B:
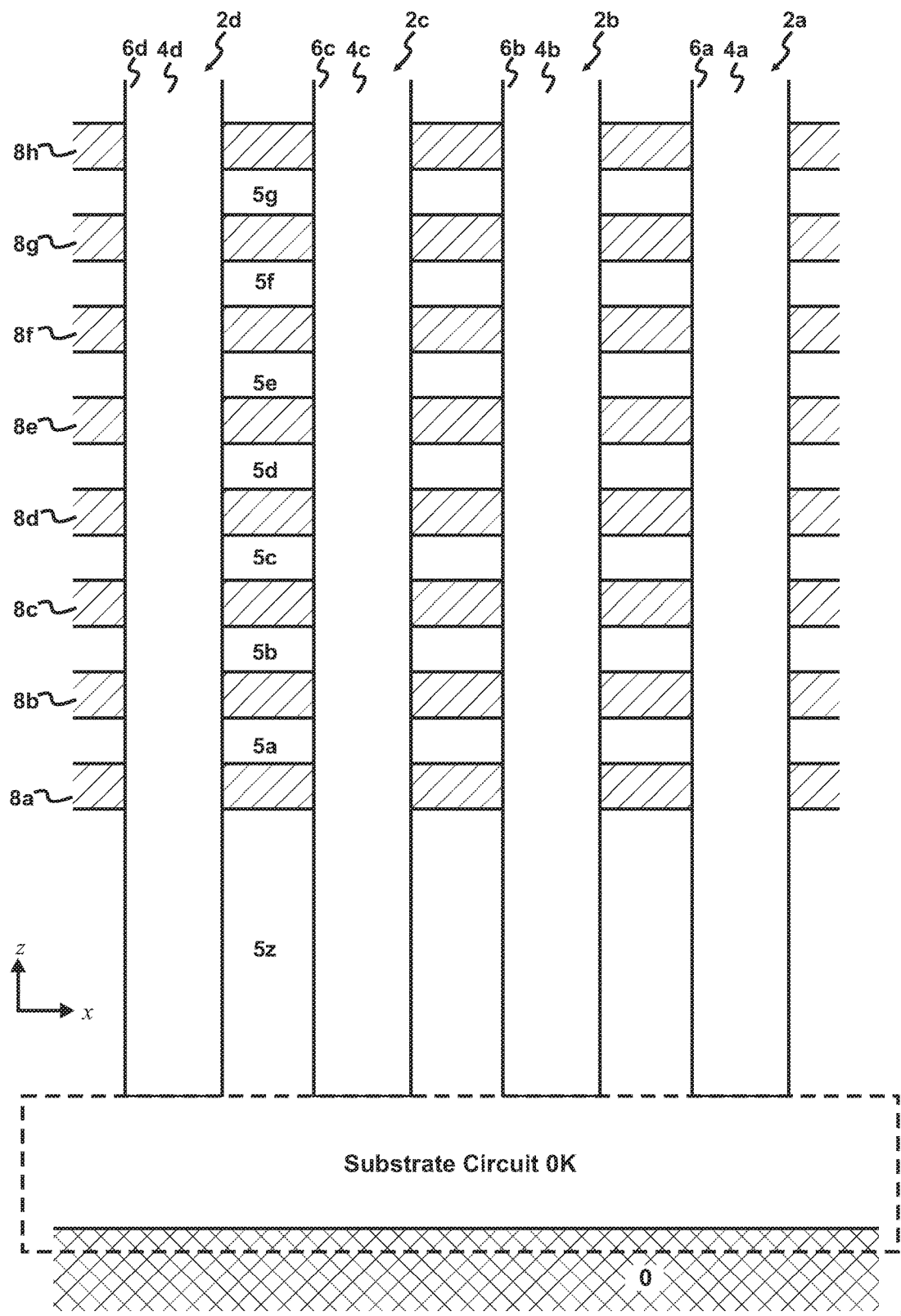
Figure 6C:
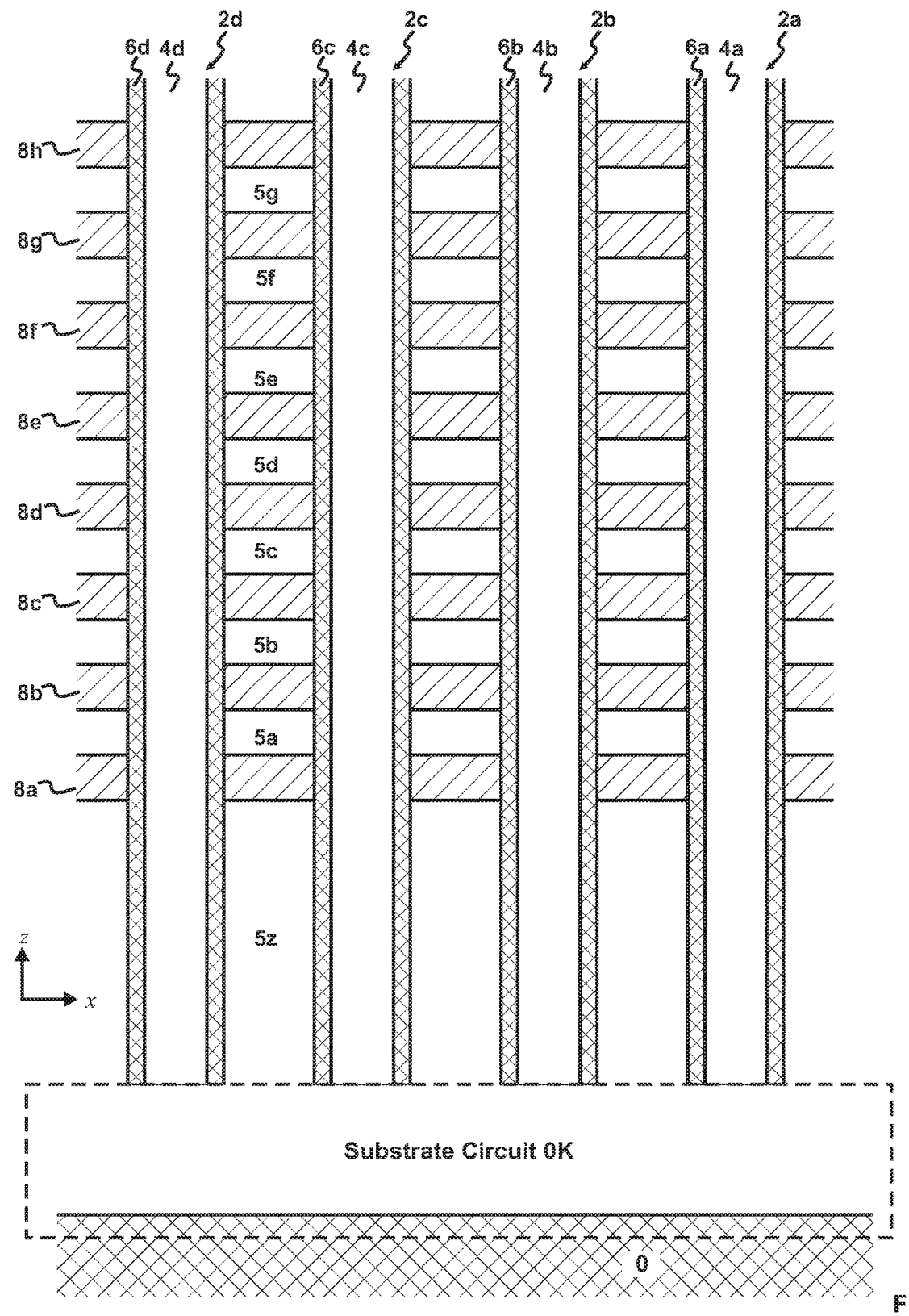

Next, the memory holes 2a-2d are etched through the horizontal address lines 8a-8h (FIG. 6B). This is followed by depositing or growing programmable layers 6a-6d on sidewalls of the memory holes 2a-2d (e.g. using an atomic-layer deposition method, i.e. ALD) (FIG. 6C). These steps are similar to those of 3D-NAND and are well known to those skilled in the art.

Figure 6D:
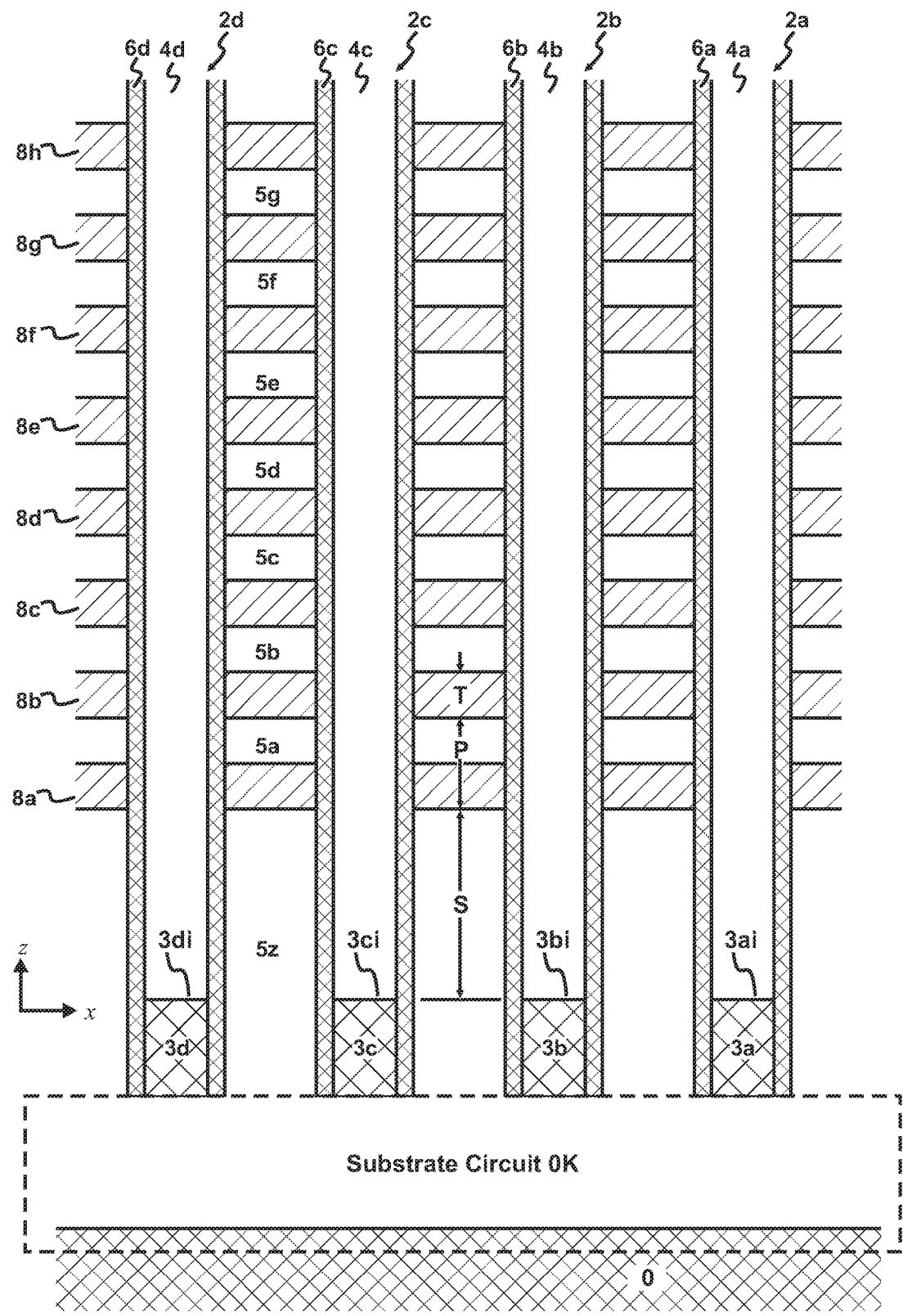

After this, the memory holes 2a-2d are filled with a heavily-doped semiconductor material and etched back. As a result, the hole electrode 3a-3d are formed at the lower ends of the memory holes 2a-2d (FIG. 6D). Finally, the remaining portions of the memory holes 2a-2d are filled with a lightly-doped semiconductor material to form lightly-doped segments 4a-4d (FIG. 5A). Overall, the preferred LDS 3D-$M_V$ die 10 has a simple structure. Because there are only two materials (lightly-doped semiconductor materials 4a-4d and the programmable layers 6a-6d) in the memory holes 2a-2d, the present invention has a simpler manufacturing process than 3D-NAND.

Figure 7:
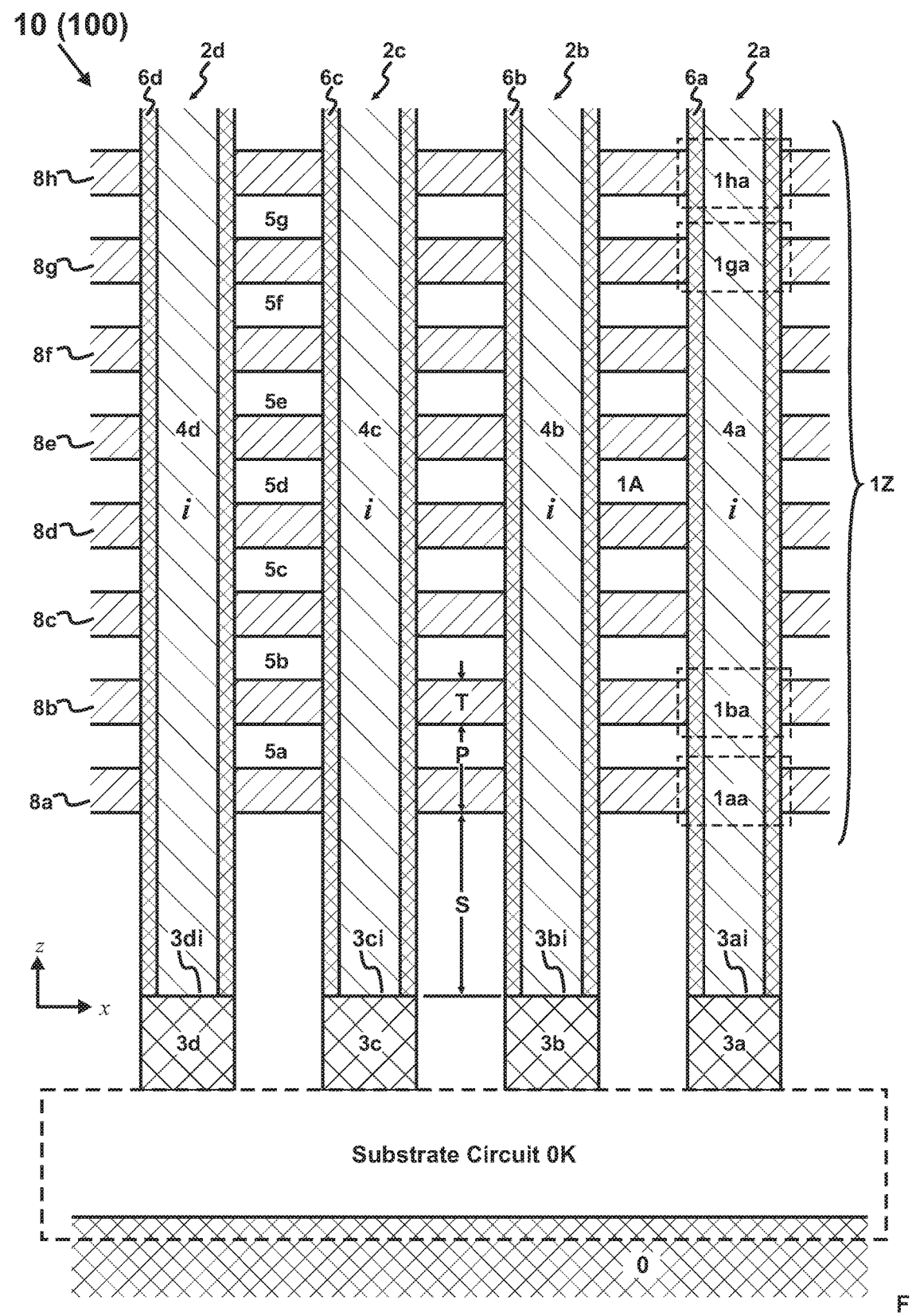
FIG. 7 is a z-x cross-sectional view of a second preferred LDS 3D-M$_V$.

FIG. 7 discloses the overall structure of a second preferred LDS 3D-$M_V$ die 10. It uses the memory cells of FIG. 3B. Different from FIG. 5A, the hole electrode 3a, although disposed in the memory hole 2a, has no programmable layer 6a around it. During manufacturing, the hole electrodes 3a-3d are formed before the programmable layers 6a-6d and then etched back. The lightly-doped segments 4a-4d are formed thereafter.

Figure 8A:
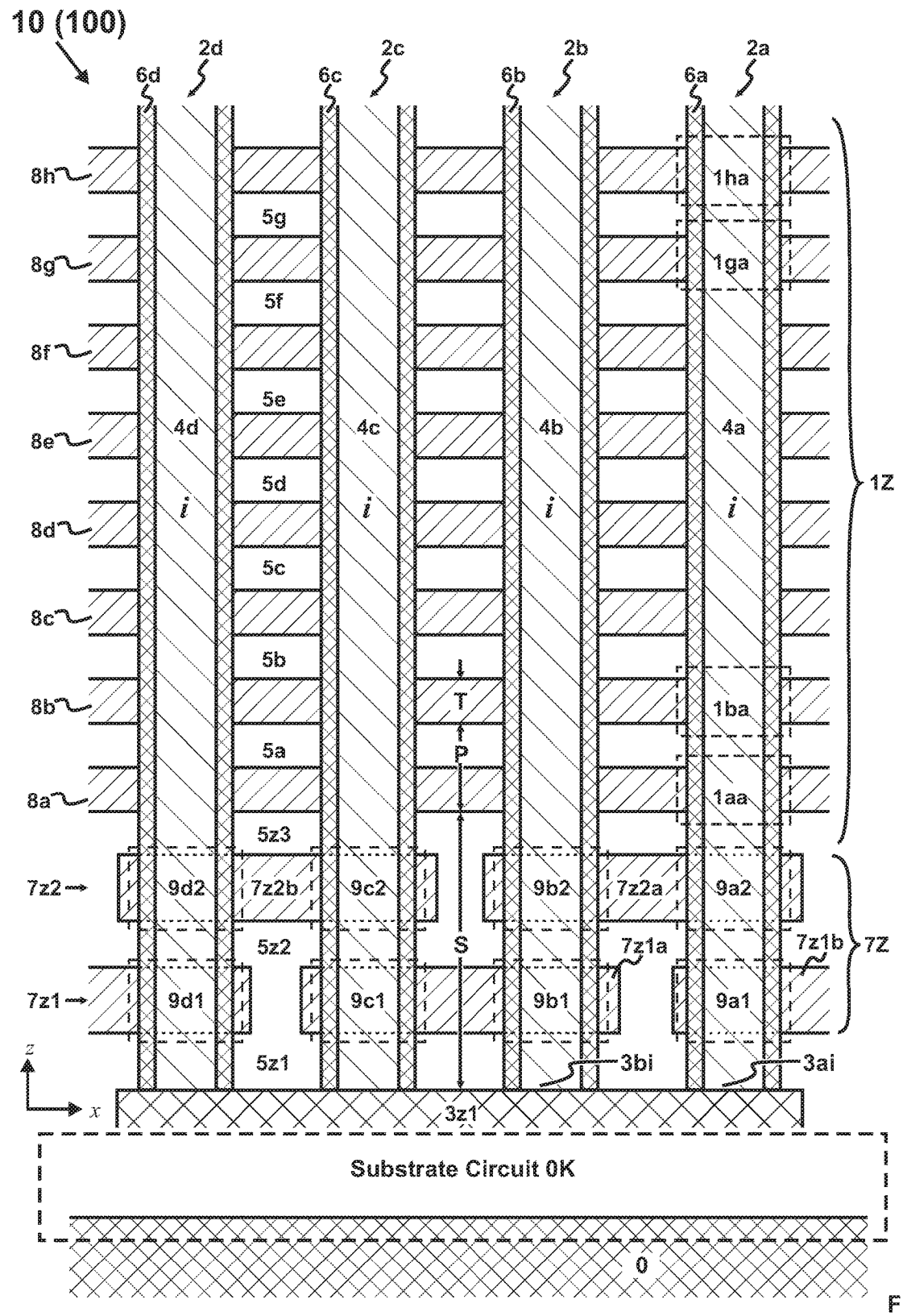
FIG. 8A is a z-x cross-sectional view of a third preferred LDS 3D-M$_V$.
Figure 8B:
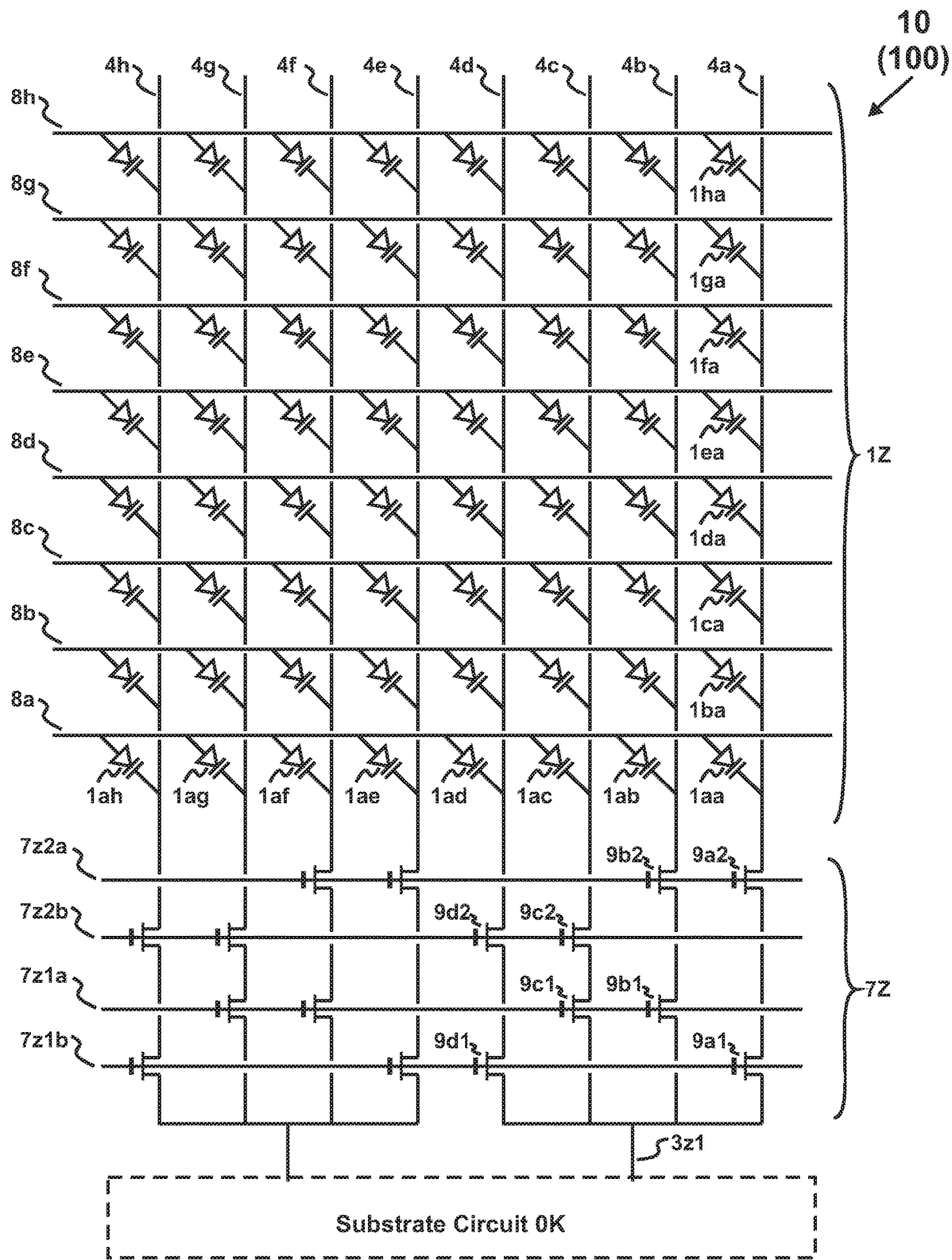
FIG. 8B is a circuit schematic of its 3D-M$_V$ array and a decoder thereof.

FIGS. 8A-8B disclose the overall structure and circuit design of a third preferred LDS 3D-$M_V$ 10. It uses the memory cells of FIG. 3C. A shared hole electrode 3z1 makes contact with all lightly-doped segments 4a-4d in the memory holes 2a-2d (FIG. 8A). For the A)-C) structures ([Para 46]-[Para 48]) of FIG. 2, the shared hole electrode 3z1 comprises heavily-doped semiconductor material. To lower its resistance, the shared hole electrode 3z1 may further comprise a layer of metallic material under the heavily-doped semiconductor material. For the D) structure ([Para 49]) of FIG. 2, the shared hole electrode 3z1 just comprises metallic material.

In addition to the horizontal address lines 8a-8h, this preferred LDS 3D-$M_V$ 10 further comprises horizontal control layers 7z1, 7z2. Each horizontal control layer 7z1 includes a plurality of horizontal control lines 7z1a, 7z1b (FIG. 8A). The memory holes 2a-2d not only penetrate through the horizontal address lines 8a-8h, but also penetrate through the horizontal control lines 7z1a, 7z1b. The lightly-doped segments 4a-4d continuously traverse both the horizontal address lines 8a-8h and the horizontal control lines 7z1a, 7z1b longitudinally. Control transistors 9a1 are formed at the intersections of the horizontal control lines 7z1a, 7z1b and the lightly-doped segments 4a-4d. These control transistors 9a1-9d1, 9a2-9d2 function as switches (e.g. pass gates) and collectively form a decoder 7Z for the 3D-$M_V$ array 1Z (FIG. 8B). Because the horizontal control lines 7z1a, 7z1b are disposed between the horizontal address lines 8a-8h and the shared contact interface 3z1, the interface-line spacing (S) is larger than the vertical pitch (P) of the horizontal lines (e.g. the horizontal address lines 8a-8h or the horizontal control lines 7z1a, 7z1b). With a typical P of more than 50 nm, this preferred structure guarantees a proper write operation.

As an operation example of the decoder 7Z, when the horizontal control line 7z1b is at a first control voltage, the transistors 9a1, 9d1 switch on; when the horizontal control line 7z1a is at a second control voltage, the transistors 9c2, 9d2 switch off; on the other hand, when the horizontal control line 7z2b is at the first control voltage, the transistors 9c2, 9d2 switch on; when the horizontal control line 7z2a is at the second control voltage, the transistors 9a2, 9b2 switch off. Under the above configuration, only the signals on the bit line 4d can be transmitted to the sense amp in the substrate circuit 0K through the shared hole electrode 3z1.

Although the horizontal address lines 8a-8h and the horizontal control lines 7z1-7z1b are both horizontal lines, they form different devices at their respective intersections with the lightly-doped segments 4a-4d: 1) memory cells 1aa-1ha are formed at the intersections between the horizontal address lines 8a-8h and the lightly-doped segments 4a-4d. These memory cells 1aa-1ha are two-terminal devices. During programming, the layers 6a-6d at the memory cells 1aa-1ha would go through material change; 2) pass gates 9a1-9b1 are formed at the intersections between the horizontal control lines 7z1a-7z1b and the lightly-doped segments 4a-4d. These pass gates 9a1-9b1 are three-terminal devices. During programming, the layers 6a-6d at the pass gates 9a1-9b1 do not go through any material change. Note that, during programming/read, the biases applied on each terminal of the memory cells 1aa-1ha and the pass gates 9a1-9b1 are different.

Referring now to FIGS. 9A-12B, three preferred embodiments of the second type of the LDS 3D-$M_V$ 100 (including from fourth to sixth preferred embodiments) are disclosed, including their overall structures, circuit designs and manufacturing processes. They respectively use the memory cell 1aa of FIGS. 4A-4C. These preferred embodiments are doublets, i.e. the overall structure is formed in two dice 10, 10', which are bonded face-to-face. The hole electrodes 3a'-3d' are disposed at the upper end of the memory holes 2a-2d, which is far away from the substrate 0, i.e. along the +z direction.

Figure 9A:
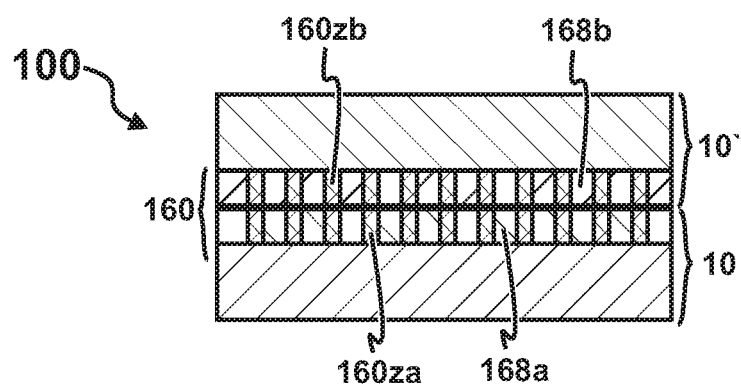
FIGS. 9A-9B are cross-sectional views of two preferred doublets.
Figure 9A:
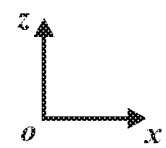
Figure 9B:
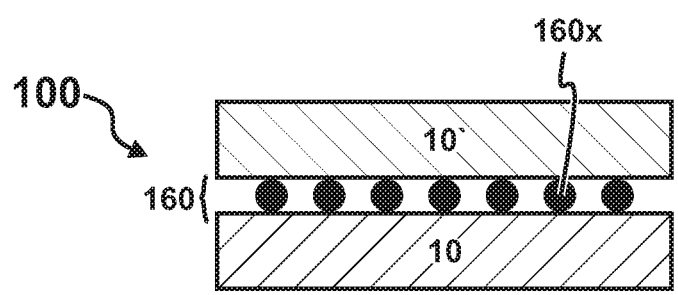
Figure 9B:
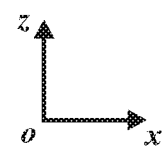

In FIGS. 9A-9B, a first die 10 is a 3D-$M_V$ die, while a second die 10' is a peripheral-circuit die, which includes at least a portion of the peripheral circuits of the 3D-$M_V$ array 1Z. Note that that portion of the peripheral circuits of the 3D-$M_V$ array 1Z is absent in the 3D-$M_V$ die 10. Apparently, the dice 10 and 10' are two different dice which are disposed on different semiconductor substrates 0, 0'.

FIGS. 9A-9B are focused on different means to implement inter-die connections. In the preferred embodiment of FIG. 9A, after forming a first insulating dielectric 168a on the front surface of the first die 10, a plurality of first vias 160za are formed in the first insulating dielectric 168a. This is followed by forming a plurality of second vias 160zb in a second insulating dielectric 168b on the front surface of the second die 10'. After this, the second die 10' is flipped. The first and second vias 160za, 160zb are aligned before the first and second dice 10, 10' are bonded. Consequently, the inter-die connections 160 are realized between the first and second dice 10, 10' through the first and second vias 160za, 160zb.

In the preferred embodiment of FIG. 9B, the front surface of the first die 10 faces upward (along the +z direction), while the frond surface of the second die 10' faces downward (along the −z direction). The inter-die connections 160 are realized through micro-bumps 160x. The preferred embodiments of FIGS. 9A-9B use wafer bonding technique: a first wafer where the first die 10 is disposed is first bonded with a second wafer where the second die 10' is disposed, then these two wafers are cut together to form the doublet 100. In these preferred embodiments, the first and second dice 10, 10' have the same area, and their edges are aligned.

Figure 10:
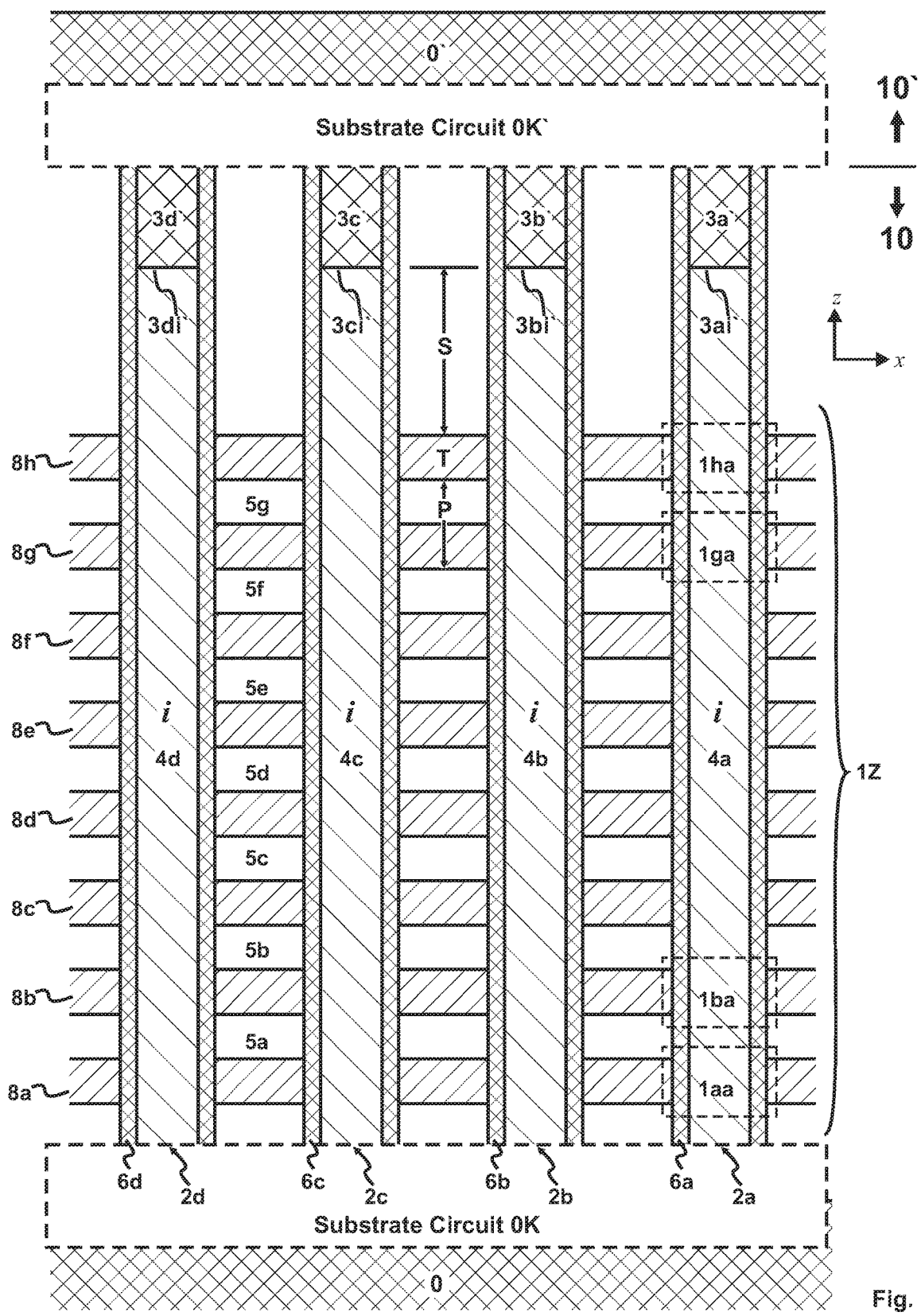
FIG. 10 is a z-x cross-sectional view of a fourth preferred LDS 3D-M$_V$.

FIG. 10 discloses the overall structure of a fourth LDS 3D-$M_V$ 100, which uses the memory cell 1aa of FIG. 4A. The hole electrodes 3a'-3d', disposed at the upper end of the memory holes 2a-2d, are surrounded by the programmable layers 6a-6d. They make contacts with the lightly-doped segments 4a-4d at the contact interfaces 3ai'-3di'. Its initial manufacturing process is similar to those in FIGS. 6A-6B. The subsequent manufacturing process includes the following steps: 1) to form the lightly-doped segments 4a-4d; 2) to dope the upper ends of the lightly-doped segments 4a-4d to form the hole electrodes 3a'-3d', or etch back a portion of the lightly-doped segments 4a-4d before depositing heavily-doped semiconductor material inside the memory holes 2a-2d. The shortest distance between the contact interfaces 3ai'-3di' and the horizontal address lines 8a-8d is the contact-line distance S. To guarantee the write operation, S should meet the requirement, i.e. S>50 nm. Note that the second substrate 0' of the second die 10' is disposed on the first die 10 and flipped. The second substrate circuit 0K' of the second die 0' is coupled with the hole electrodes 3a'-3d'. At least a portion of the peripheral circuit of the 3D-$M_V$ array 1Z is disposed on the second substrate circuit 0K'.

Figure 11:
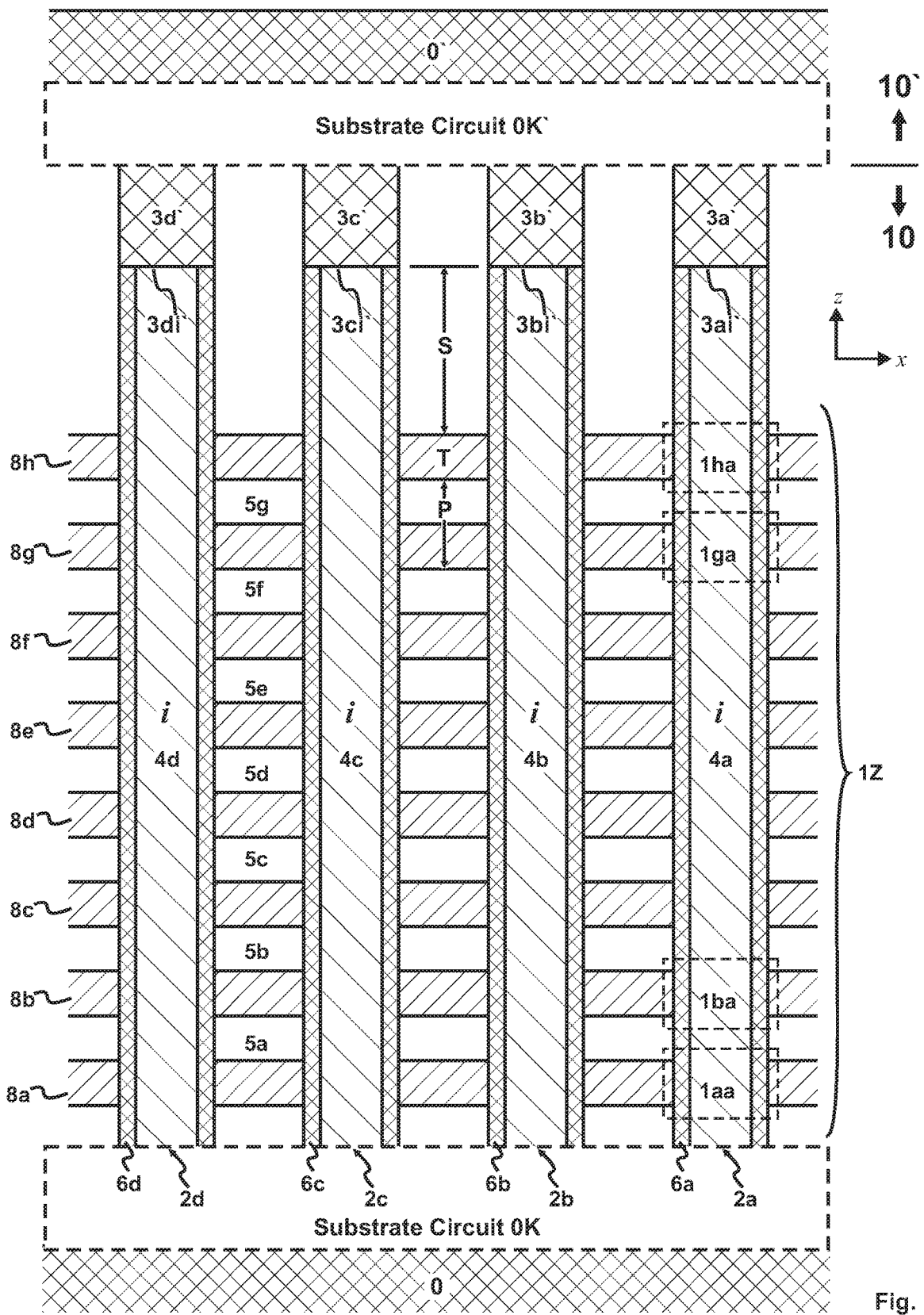
FIG. 11 is a z-x cross-sectional view of a fifth preferred LDS 3D-M$_V$.

FIG. 11 discloses the overall structure of a fifth preferred LDS 3D-$M_V$ 100. It uses the memory cell of FIG. 4B. The hole electrodes 3a'-3d' are not surrounded by any programmable layer. Different from FIG. 10, forming the hole electrodes 3a'-3d' involves the following steps: 1) etch back a portion of the lightly-doped segments 4a-4d and the programmable layers 6a-6d; 2) deposit heavily-doped semiconductor material inside the memory holes 2a-2d.

Figure 12A:
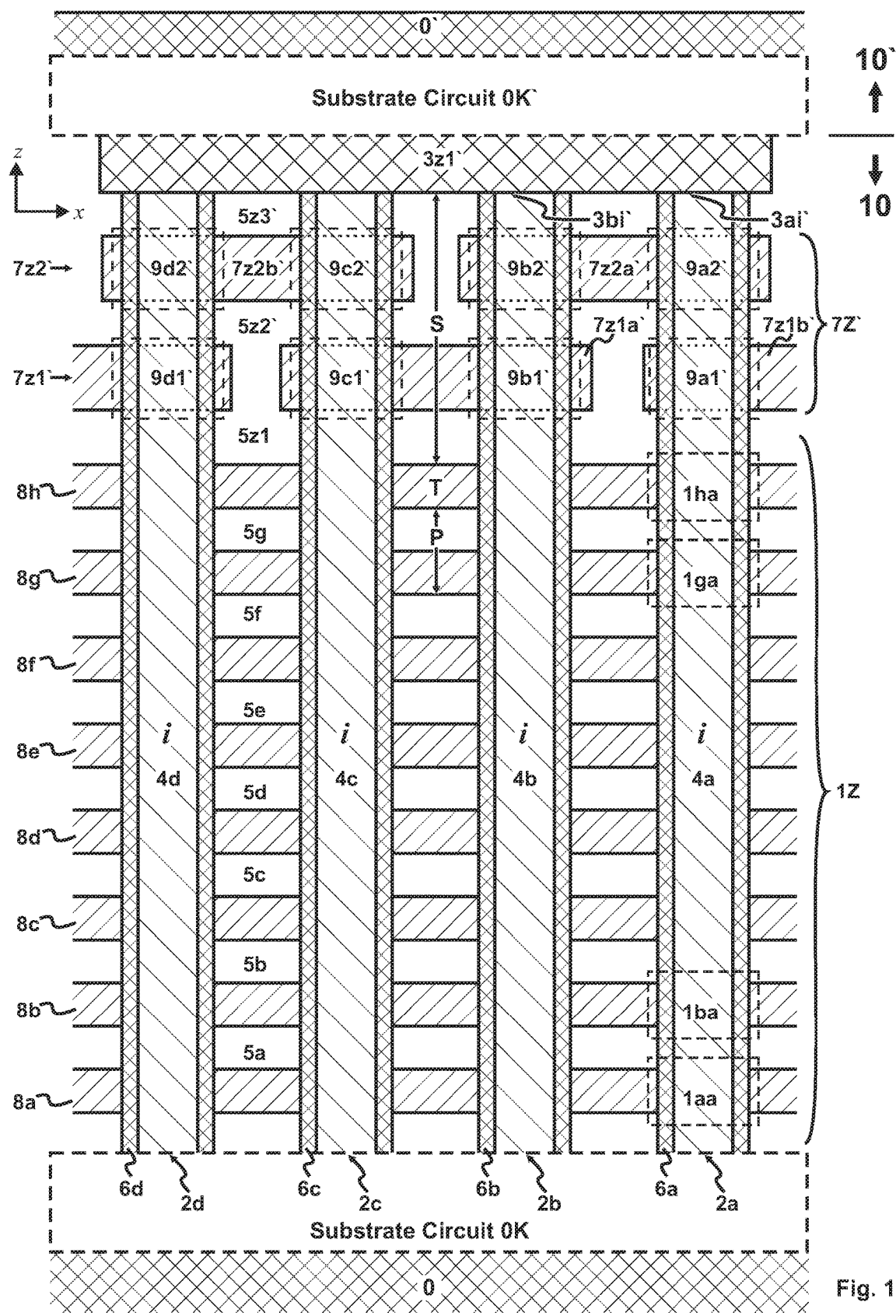
FIG. 12A is a z-x cross-sectional view of a sixth preferred LDS 3D-M$_V$.
Figure 12B:
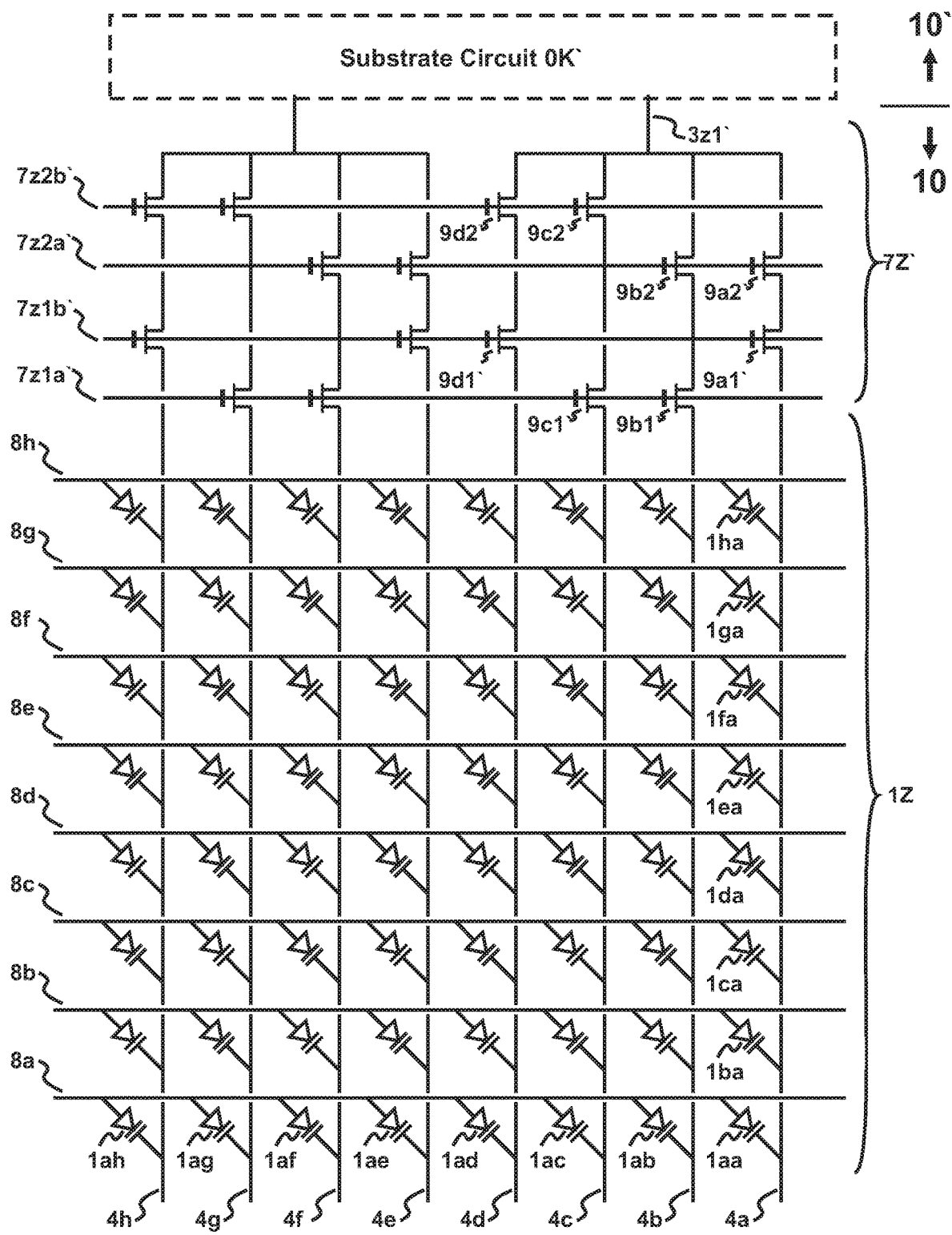
FIG. 12B is a circuit schematic of its 3D-M$_V$ array and a decoder thereof.

FIGS. 12A-12B disclose the overall structure and the circuit design of a sixth preferred LDS 3D-$M_V$ 100. It uses the memory cell of FIG. 4C. A shared hole electrode 3z1 makes contact with all lightly-doped segments 4a-4d in the memory holes 2a-2d. This preferred LDS 3D-M$_V$ 100 further comprises horizontal control layers 7z1', 7z2'. Each horizontal control layer 7z1' includes a plurality of horizontal control lines 7z1a', 7z1b' (FIG. 12A). The memory holes 2a-2d not only penetrate through the horizontal address lines 8a-8h, but also penetrate through the horizontal control lines 7z1a', 7z1b'. The lightly-doped segments 4a-4d continuously traverse both the horizontal address lines 8a-8h and the horizontal control lines 7z1a', 7z1b' longitudinally. Control transistors 9b1', 9a1' are formed at the intersections of the horizontal control lines 7z1a', 7z1b' and the lightly-doped segment 4a, 4b (FIG. 12A). These control transistors 9a1'-9d1', 9a2'-9d2' function as switches (e.g. pass gates) and collectively form a decoder 7Z' for the 3D-M$_V$ array 1Z (FIG. 12B).

On the other hand, the memory holes 2a-2h of the conventional 3D-M$_V$ are formed using DUV (deep ultraviolet) lithography. They all have circular shape. The smallest circular holes formed with a single DUV exposure have a diameter of 54 nm and a horizontal pitch of 90 nm. To minimize the dimension of the memory holes, the present invention discloses a non-circular-hole (NCH) 3D-M$_V$. In fact, the DUV lithography is best at making parallel lines, not circles. The minimum width of parallel lines made through a single DUV exposure is 38 nm, with a minimum horizontal pitch of 76 nm. To take advantage of this property of the DUV lithography, the preferred NCH 3D-M$_V$ comprises a plurality of non-circular memory holes. The lateral cross-section (along the radius or x-y directions, not along the depth or z direction) of each non-circular memory hole includes two pairs of parallel sides. Each pair of parallel sides is formed with a single DUV exposure and has a spacing of <50 nm (could be as small as 38 nm). Examples of the preferred NCH 3D-M$_V$ include rectangular (or, square)-hole 3D-M$_V$ (FIGS. 13-14BC), hexagonal-hole 3D-M$_V$ (FIGS. 15-16B) and others. To those skilled in the art, the concept of the NCH 3D-M$_V$ can be easily extended to other non-circular holes in any integrated circuit (e.g. 3D-NAND).

Figure 13:
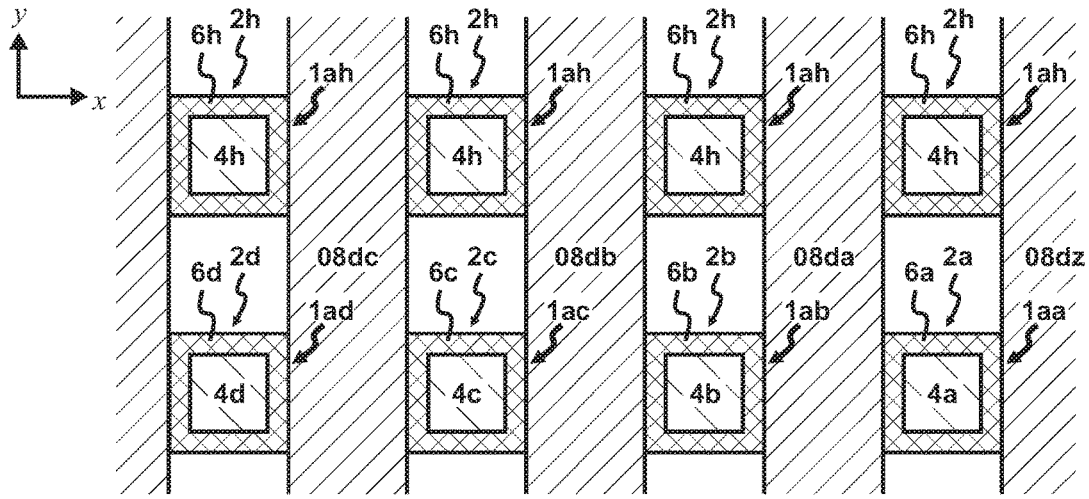
FIG. 13 is an x-y top view of a preferred square-hole 3D-M$_V$.

FIG. 13 shows a preferred square-hole 3D-M$_V$. It comprises a plurality of horizontal address lines 08dz, 08da-08dc. They take the shape of strips, with width and spacing equal to the minimum dimension formed by a single DUV exposure. This preferred embodiment is different from FIG. 5B. In FIG. 5B, the horizontal address line 8a takes the form of blocks (the width of a block is large enough to accommodate multiple rows of memory holes 2a-2h). In this preferred embodiment, the memory hole 2a is disposed between two horizontal address lines 08dz, 08da and could form one memory cell with each horizontal address line (e.g. 08dz). As a result, each memory cell in the preferred NCH 3D-M$_V$ could store two bits of information and realize 2-bit-per-cell. In this preferred embodiment, the shape of the memory cell 2a is a square. Its dimension is 38 nm, far smaller than the diameter of circular (i.e. 54 nm). Using only the DUV lithography, the preferred square-hole 3D-M$_V$ has a larger storage density than the circular-hole 3D-M$_V$.

Figure 14A:
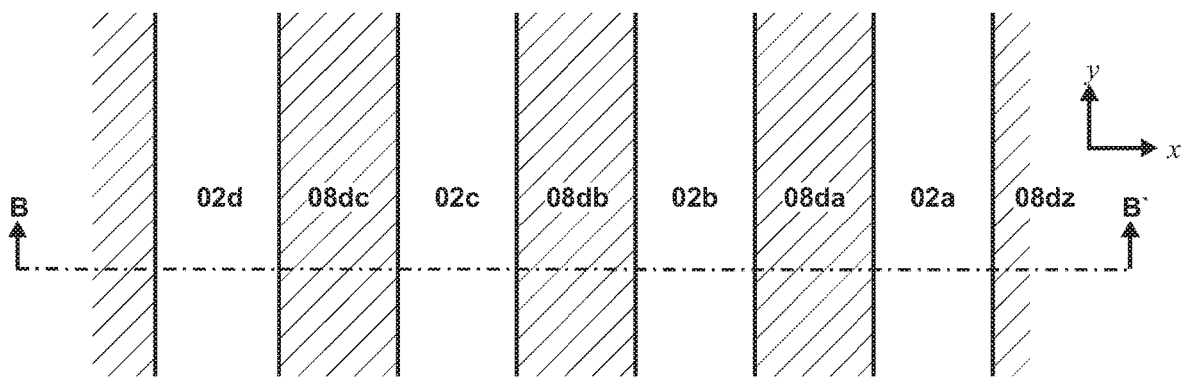
FIGS. 14AA-14BC disclose two manufacturing steps to form the preferred square-hole 3D-M$_V$ of FIG. 13.
Figure 14A:
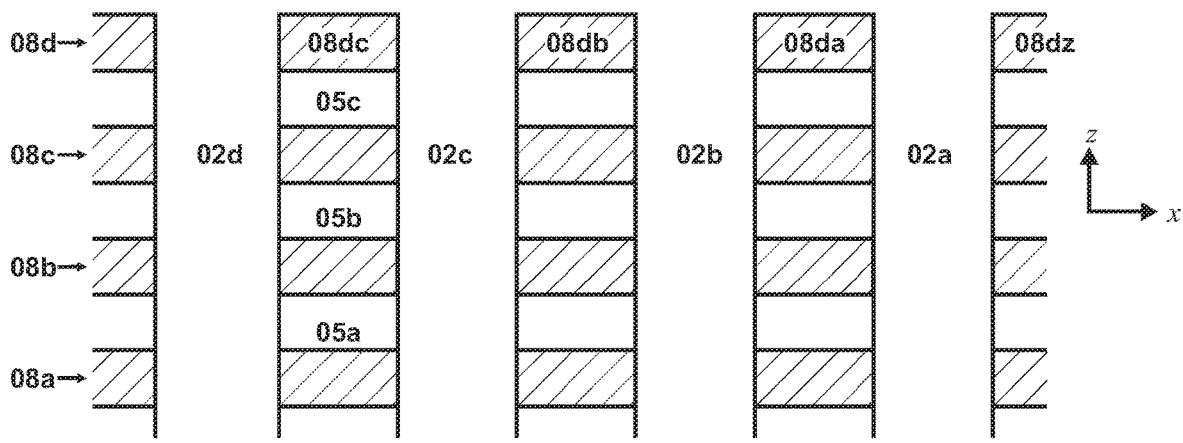

FIGS. 14AA-14AB disclose a first manufacturing step to form the preferred square-hole 3D-M$_V$ of FIG. 13. After forming the horizontal address layers 08a-08d (which are separated by the inter-layer dielectrics 05a-05c along the z direction), a first DUV exposure is performed to form a first set of parallel-line patterns. These parallel-line patterns are etched to form trenches 02a-02d, which separate the horizontal address layers into horizontal address lines 08da-08dc. Here, the width and spacing of the horizontal address lines 08da-08dc are the minimum dimension formed by a single DUV exposure (e.g. 38 nm).

Figure 14B:
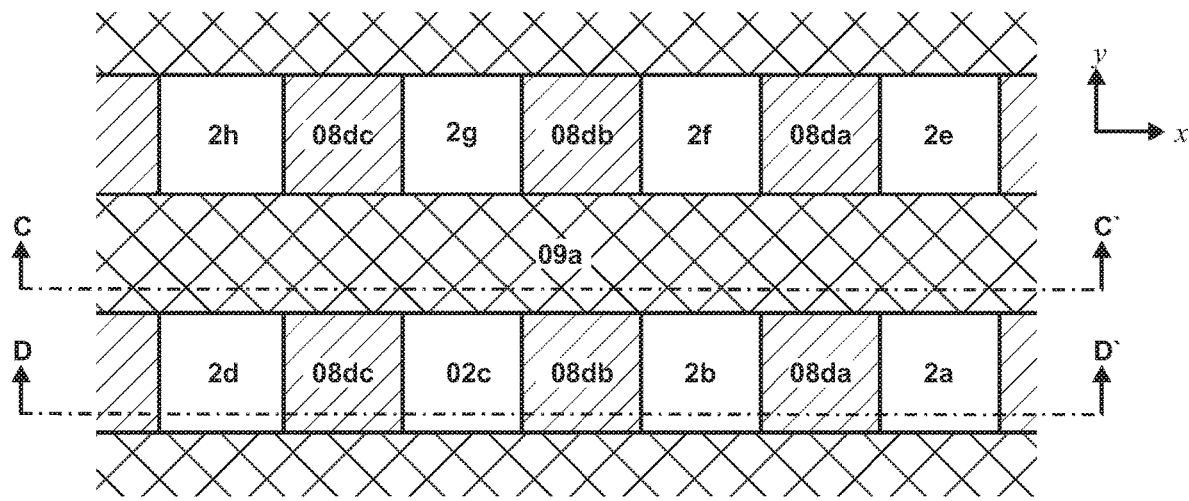
FIG. 14B is an x-y top view at the second manufacturing step.
Figure 14B:
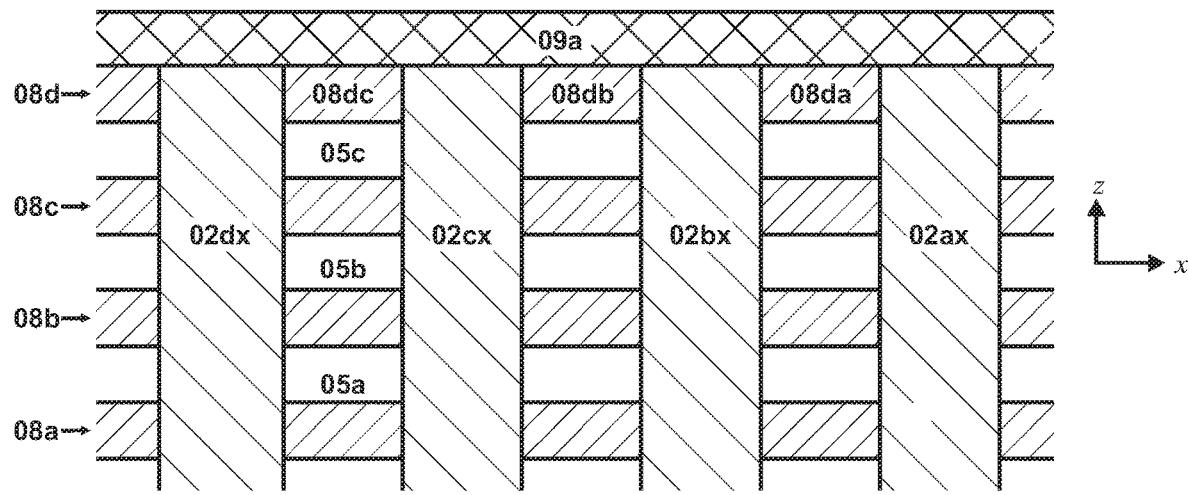
Figure 14B:
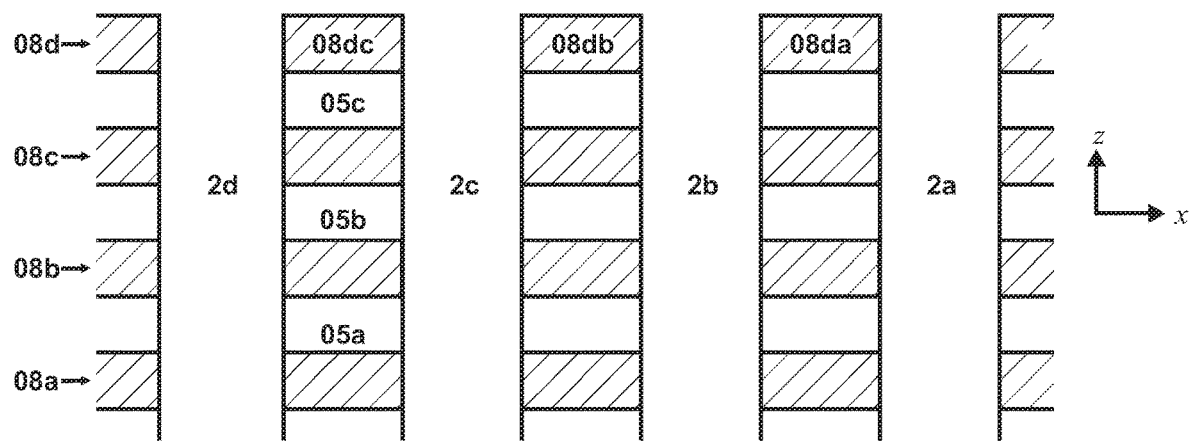

FIGS. 14BA-14BC disclose a second manufacturing step to form the preferred square-hole 3D-M$_V$. First the trenches 02a-02d are filled with trench dielectrics 02ax-02dx and planarized. An etch-stop layer is then formed on the trench dielectrics 02ax-02dx. At this moment, a second DUV exposure is performed to form a second set of parallel-line patterns. These parallel-lie patterns are etched to form etch-stop strips 09a. Again, the width and spacing of these etch-stop strips 09a are the minimum dimension formed by a single DUV exposure. In this preferred embodiment, the etch-stop strips 09a intersect with the horizontal address lines 08da-08dc at 900 (FIG. 14BA). Then another etch step is performed to etch the trench dielectrics 02ax-02dx using the horizontal address lines 08da-08dc and the etch-stop strips 09a as hard masks. As a result, the portion of the trench dielectrics 02ax-02dx under the horizontal address lines 08da-08dc or the etch-stop strips 09a are not etched (FIG. 14BB), while the portion not under the horizontal address lines 08da-08dc or the etch-stop strips 09a are etched to form square holes 2a-2d (FIG. 14BC). Note that these square holes 2a-2d have the minimum dimension from a single DUV exposure (e.g. 38 nm) and their horizontal pitch is smaller than 90 nm.

Figure 15:
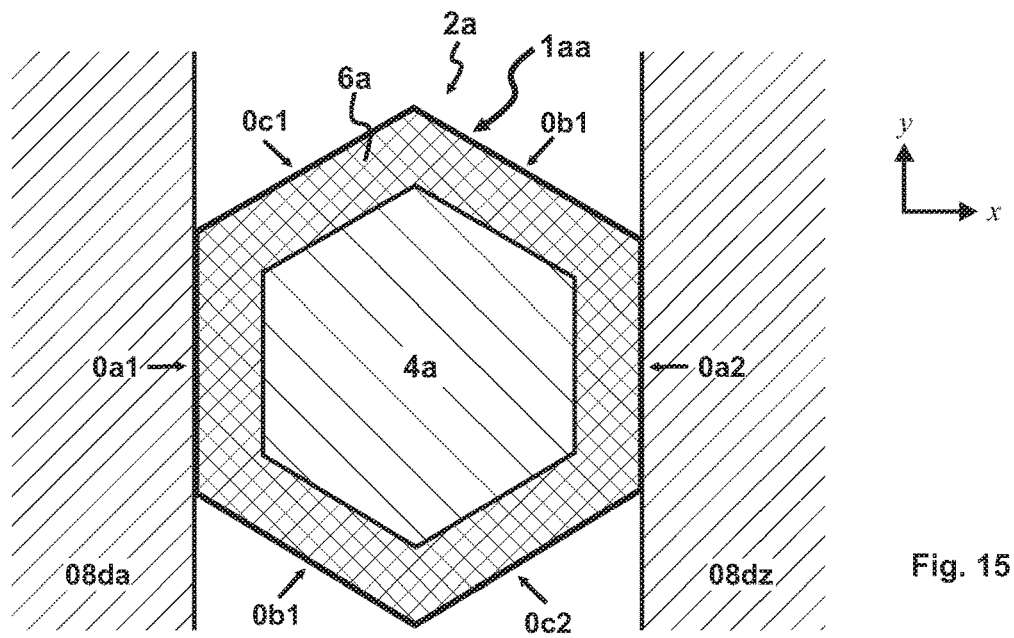
FIG. 15 is an x-y top view of a preferred hexagonal-hole 3D-M$_V$.

Besides the square-hole 3D-M$_V$, other types of the NCH 3D-M$_V$ may also be fabricated. FIG. 15 illustrates a preferred hexagonal-hole 3D-M$_V$. Its memory hole 2a has six sides, which form three pairs of parallel lines, including a first pair 0a1, 0a2; a second pair 0b1, 0b2; a third pair 0c1, 0c2. The width and spacing between parallel lines within each pair are the minimum dimension from a single DUV exposure.

Figure 16A:
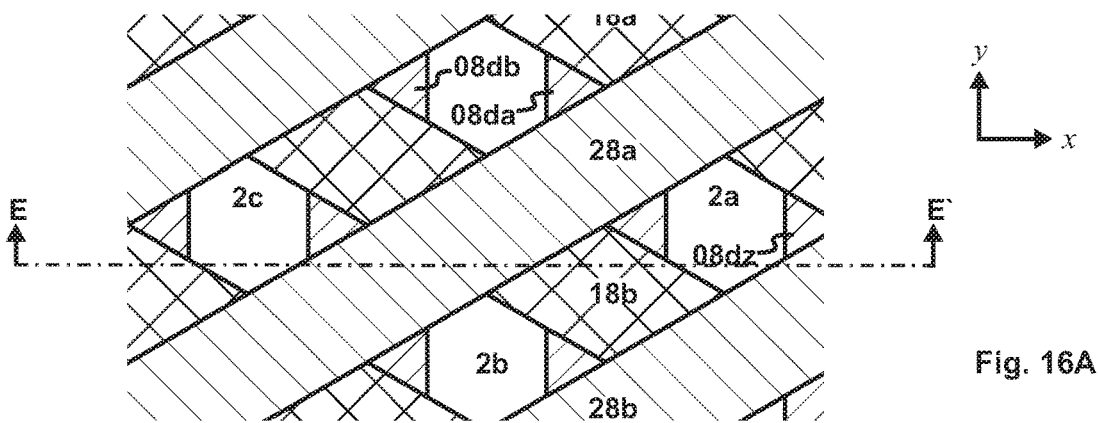
FIGS. 16A-16B disclose a manufacturing step to form the preferred hexagonal-hole 3D-M$_V$.
Figure 16B:
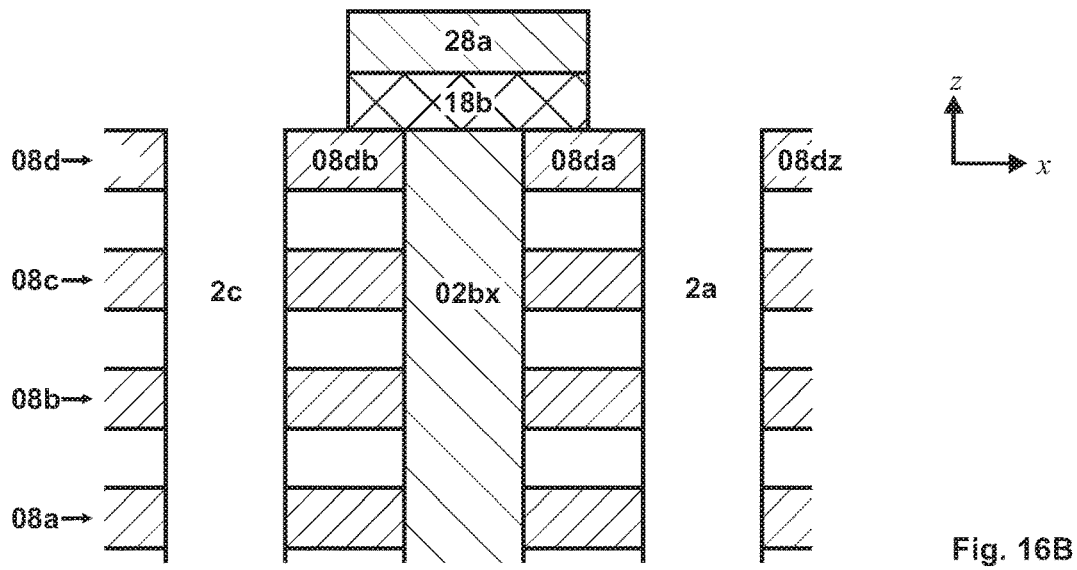

FIGS. 16A-16B disclose the manufacturing steps to form the preferred hexagonal 3D-M$_V$ of FIG. 15. Similar to FIGS. 14AA-14AB, the trenches 02a-02d are etched and filled with trench dielectrics 02ax-02dx. After that, a first planarized etch-stop strips 18a, 18b and a second planarized etch-stop strips 28a, 28b are separately formed. During the final etch step to the trench dielectrics 02ax-02dx, the portion of the trench dielectrics 02ax-02dx under the horizontal address lines 08da-08dc or the etch-stop strips 18a, 18b, 28a, 28b are not etched; whereas, the portion not under the horizontal address lines 08da-08dc or the etch-stop strips 18a, 18b, 28a, 28b are etched to form hexagonal holes 2a-2c.

While illustrative embodiments have been shown and described, it would be apparent to those skilled in the art that many more modifications than that have been mentioned above are possible without departing from the inventive concepts set forth therein. The invention, therefore, is not to be limited except in the spirit of the appended claims.

What is claimed is:

1. A three-dimensional vertical memory, comprising horizontal address lines and first and second memory holes there-through, wherein:
    said first memory hole comprises a first programmable layer fully covering sidewalls of said first memory hole, and a first semiconductor material fully filling said first memory hole both laterally and longitudinally;
    said second memory hole comprises a second programmable layer fully covering sidewalls of said second memory hole, and a second semiconductor material fully filling said second memory hole both laterally and longitudinally;

said first and second semiconductor materials are both in contact with a shared electrode at respective ends of said first and second memory holes; and, said shared electrode comprises at least a third semiconductor material;

wherein, said first, second and third semiconductor materials have a same doping type; said first and second semiconductor material are similarly doped, but both more lightly doped than said third semiconductor material.

2. The memory according to claim 1, wherein a smallest distance between said horizontal address lines and said shared electrode is larger than a vertical pitch of said horizontal address lines.

3. The memory according to claim 1 being a singlet, further comprising a semiconductor substrate, wherein:

said horizontal address lines are disposed above said semiconductor substrate; and, said shared electrode is disposed between said horizontal address lines and said semiconductor substrate.

4. The memory according to claim 1 being a doublet, further comprising:

a first die, wherein said horizontal address lines are disposed in said first die;

a second die, wherein said second die comprises a second substrate circuit;

wherein said shared electrode is disposed between said second substrate circuit and said horizontal address lines.

5. The memory according to claim 1, further comprising a horizontal control line between said horizontal address lines and said shared electrode.

6. The memory according to claim 5, further comprising a control transistor at the intersection of said horizontal control line and said first or second memory hole.

* * * * *